(12) United States Patent
Li et al.

(10) Patent No.: US 12,381,190 B2
(45) Date of Patent: *Aug. 5, 2025

(54) WARM DIMMING LED-FILAMENTS AND LED-FILAMENT LAMPS

(71) Applicant: Intematix Corporation, Fremont, CA (US)

(72) Inventors: Yi-Qun Li, Danville, CA (US); Jun-Gang Zhao, Fremont, CA (US); Gang Wang, Sunnyvale, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/406,178

(22) Filed: Jan. 7, 2024

(65) Prior Publication Data
US 2024/0145442 A1 May 2, 2024

Related U.S. Application Data

(63) Continuation of application No. 17/718,746, filed on Apr. 12, 2022, now Pat. No. 12,062,644, which is a (Continued)

(51) Int. Cl.
*H01L 25/075* (2006.01)
*C09K 11/61* (2006.01)
(Continued)

(52) U.S. Cl.
CPC ........ *H01L 25/0753* (2013.01); *C09K 11/617* (2013.01); *C09K 11/665* (2013.01);
(Continued)

(58) Field of Classification Search
CPC ....... F21K 9/232; F21K 9/238; H01L 33/504; H01L 25/0753
See application file for complete search history.

(56) References Cited

U.S. PATENT DOCUMENTS

| | | |
|---|---|---|
| 5,998,925 A | 12/1999 | Shimizu et al. |
| 6,069,440 A | 5/2000 | Shimizu et al. |

(Continued)

FOREIGN PATENT DOCUMENTS

| | | |
|---|---|---|
| CN | 1326230 A | 12/2001 |
| CN | 1719633 A | 1/2006 |

(Continued)

OTHER PUBLICATIONS

CN202080035454, Office Action, Sep. 14, 2023.
(Continued)

*Primary Examiner* — William N Harris
(74) *Attorney, Agent, or Firm* — Shirley A. Recipon

(57) ABSTRACT

An embodiment of an LED lamp that generates light of a color temperature that decreases with decreasing power applied to the LED lamp may include at least one lighting arrangement that may include a first LED array of serially connected first LED chips, a second LED array of serially connected second LED chips; a first photoluminescence layer covering the first LED array for generating light of a first color temperature; a second photoluminescence layer covering the second LED array for generating light of a second different color temperature; and a linear resistor serially connected to the first LED array, wherein the first LED array and second LED array are connected in parallel.

12 Claims, 14 Drawing Sheets

SECTION A-A

Related U.S. Application Data continuation of application No. 17/477,499, filed on Sep. 16, 2021, now abandoned, which is a continuation-in-part of application No. PCT/US2020/023187, filed on Mar. 17, 2020, which is a continuation of application No. 16/540,019, filed on Aug. 13, 2019, now Pat. No. 11,342,311.

(60) Provisional application No. 62/820,249, filed on Mar. 18, 2019, provisional application No. 62/831,699, filed on Apr. 9, 2019, provisional application No. 62/941,735, filed on Nov. 28, 2019, provisional application No. 62/941,734, filed on Nov. 28, 2019.

(51) Int. Cl.
| | |
|---|---|
| *C09K 11/66* | (2006.01) |
| *C09K 11/67* | (2006.01) |
| *F21K 9/232* | (2016.01) |
| *F21K 9/238* | (2016.01) |
| *F21K 9/278* | (2016.01) |
| *F21Y 103/10* | (2016.01) |
| *F21Y 107/50* | (2016.01) |
| *F21Y 113/17* | (2016.01) |
| *F21Y 115/10* | (2016.01) |
| *H10D 1/47* | (2025.01) |
| *H10H 20/80* | (2025.01) |
| *H10H 20/851* | (2025.01) |
| *H10H 20/857* | (2025.01) |

(52) U.S. Cl.
CPC .......... *C09K 11/675* (2013.01); *F21K 9/232* (2016.08); *F21K 9/238* (2016.08); *F21K 9/278* (2016.08); *H10D 1/47* (2025.01); *H10H 20/8513* (2025.01); *H10H 20/8515* (2025.01); *H10H 20/857* (2025.01); *F21Y 2103/10* (2016.08); *F21Y 2107/50* (2016.08); *F21Y 2113/17* (2016.08); *F21Y 2115/10* (2016.08); *H10H 20/882* (2025.01)

(56) References Cited

U.S. PATENT DOCUMENTS

| | | | |
|---|---|---|---|
| 6,791,259 | B1 | 9/2004 | Stokes et al. |
| 8,529,791 | B2 | 9/2013 | Wu et al. |
| 8,547,010 | B2 | 10/2013 | Jagt |
| 8,597,545 | B1 | 12/2013 | Liu et al. |
| 8,604,678 | B2 | 12/2013 | Dai et al. |
| 8,614,539 | B2 | 12/2013 | Dai et al. |
| 8,663,502 | B2 | 3/2014 | Tao |
| 8,710,754 | B2 | 4/2014 | Baddela et al. |
| 8,890,403 | B2 | 11/2014 | Sakuta et al. |
| 8,957,585 | B2 | 2/2015 | Li et al. |
| 9,261,242 | B2 | 2/2016 | Ge et al. |
| 9,752,734 | B2 | 9/2017 | Tanda et al. |
| 9,967,943 | B1 | 5/2018 | Wang et al. |
| 10,026,874 | B1 | 7/2018 | Li et al. |
| 10,468,564 | B1 | 11/2019 | Zhao et al. |
| 10,479,937 | B2 | 11/2019 | Zhu et al. |
| 10,495,263 | B2 | 12/2019 | Chowdhury et al. |
| 10,535,805 | B2 | 1/2020 | Li et al. |
| 10,568,172 | B2 | 2/2020 | Li et al. |
| 10,950,585 | B2 | 3/2021 | Li et al. |
| 11,781,714 | B2 | 10/2023 | Wang et al. |
| 2004/0124758 | A1 | 7/2004 | Danielson et al. |
| 2004/0150991 | A1 | 8/2004 | Ouderkirk et al. |
| 2005/0116635 | A1 | 6/2005 | Walson et al. |
| 2005/0242326 | A1 | 11/2005 | Comanzo et al. |
| 2007/0045761 | A1 | 3/2007 | Basin et al. |
| 2007/0080364 | A1 | 4/2007 | Hsiung |
| 2007/0108888 | A1 | 5/2007 | Chen et al. |
| 2007/0125984 | A1 | 6/2007 | Tian et al. |
| 2007/0139949 | A1 | 6/2007 | Tanda et al. |
| 2008/0079015 | A1 | 4/2008 | Krummacher |
| 2009/0057699 | A1 | 3/2009 | Basin et al. |
| 2010/0013373 | A1 | 1/2010 | Hata et al. |
| 2010/0124243 | A1 | 5/2010 | Hussell et al. |
| 2010/0142189 | A1 | 6/2010 | Hong et al. |
| 2010/0163892 | A1 | 7/2010 | Liu |
| 2010/0277069 | A1 | 11/2010 | Janik et al. |
| 2010/0289044 | A1 | 11/2010 | Krames et al. |
| 2011/0001157 | A1 | 1/2011 | McKenzie et al. |
| 2011/0068354 | A1 | 3/2011 | Tran et al. |
| 2011/0227469 | A1 | 9/2011 | Yuan et al. |
| 2012/0032219 | A1 | 2/2012 | Ooyabu et al. |
| 2012/0217862 | A1 | 8/2012 | Matsuda et al. |
| 2012/0218746 | A1 | 8/2012 | Winton |
| 2012/0275157 | A1 | 11/2012 | Hsu |
| 2012/0306340 | A1 | 12/2012 | Hoetzl et al. |
| 2013/0069089 | A1 | 3/2013 | Hussell et al. |
| 2013/0111744 | A1 | 5/2013 | Tischler et al. |
| 2013/0193465 | A1 | 8/2013 | Xu et al. |
| 2013/0264937 | A1 | 10/2013 | Sakuta et al. |
| 2013/0277694 | A1 | 10/2013 | Sakuta et al. |
| 2013/0320363 | A1 | 12/2013 | Pan et al. |
| 2014/0103373 | A1 | 4/2014 | Li et al. |
| 2014/0159612 | A1 | 6/2014 | Tong |
| 2014/0167601 | A1 | 6/2014 | Harry et al. |
| 2014/0198373 | A1 | 7/2014 | Ray |
| 2014/0231857 | A1 | 8/2014 | Nammalwar et al. |
| 2014/0353704 | A1 | 12/2014 | Kamikawa |
| 2015/0008835 | A1 | 1/2015 | Sugiura et al. |
| 2015/0035430 | A1 | 2/2015 | Yoshida et al. |
| 2015/0069442 | A1 | 3/2015 | Liu et al. |
| 2015/0084086 | A1 | 3/2015 | Hsu et al. |
| 2015/0270449 | A1 | 9/2015 | Park et al. |
| 2015/0280080 | A1 | 10/2015 | Wada et al. |
| 2015/0329770 | A1 | 11/2015 | Kaneyoshi et al. |
| 2015/0357528 | A1 | 12/2015 | Tsumori et al. |
| 2015/0364659 | A1 | 12/2015 | Setlur et al. |
| 2016/0097495 | A1 | 4/2016 | Yamamoto et al. |
| 2016/0116124 | A1 | 4/2016 | Podowitz et al. |
| 2016/0161067 | A1 | 6/2016 | Oepts et al. |
| 2016/0177178 | A1 | 6/2016 | Choi et al. |
| 2016/0202555 | A1 | 7/2016 | Tanaka |
| 2016/0233387 | A1 | 8/2016 | Kitano et al. |
| 2016/0233393 | A1 | 8/2016 | Okuno et al. |
| 2016/0254416 | A1 | 9/2016 | Cheng |
| 2016/0351757 | A1 | 12/2016 | Yoshimura et al. |
| 2016/0372638 | A1 | 12/2016 | Todorov et al. |
| 2016/0377237 | A1* | 12/2016 | Zhang ............... F21K 9/232 362/311.02 |
| 2017/0125650 | A1 | 5/2017 | Pickett et al. |
| 2017/0145310 | A1 | 5/2017 | Li et al. |
| 2017/0236982 | A1 | 8/2017 | Akiyama et al. |
| 2017/0283695 | A1 | 10/2017 | Yoshida et al. |
| 2018/0040786 | A1 | 2/2018 | Chen |
| 2018/0053882 | A1 | 2/2018 | Cheng et al. |
| 2018/0204984 | A1 | 7/2018 | Li et al. |
| 2018/0212128 | A1 | 7/2018 | Hayashi |
| 2018/0219144 | A1 | 8/2018 | Perkins et al. |
| 2018/0226549 | A1 | 8/2018 | Nakabayashi et al. |
| 2018/0287019 | A1 | 10/2018 | Hashimoto et al. |
| 2018/0315899 | A1 | 11/2018 | Li et al. |
| 2018/0328543 | A1 | 11/2018 | Bergmann et al. |
| 2019/0013304 | A1 | 1/2019 | Luo et al. |
| 2019/0139943 | A1 | 5/2019 | Tiwari et al. |
| 2019/0194537 | A1 | 6/2019 | Sekiguchi et al. |
| 2019/0195431 | A1* | 6/2019 | Chen ..................... F21V 3/02 |
| 2019/0198719 | A1 | 6/2019 | Fujioka et al. |
| 2019/0198722 | A1 | 6/2019 | Nakabayashi et al. |
| 2019/0338893 | A1* | 11/2019 | Spehalski ............ F21K 9/232 |
| 2020/0056747 | A1 | 2/2020 | Jiang et al. |
| 2020/0058835 | A1 | 2/2020 | Rintamaki et al. |
| 2020/0066949 | A1 | 2/2020 | Jiang et al. |
| 2020/0088355 | A1 | 3/2020 | Dutta et al. |
| 2020/0176646 | A1 | 6/2020 | Li et al. |

(56) References Cited

U.S. PATENT DOCUMENTS

| | | |
|---|---|---|
| 2020/0287102 A1 | 9/2020 | Bertram et al. |
| 2020/0303355 A1 | 9/2020 | Wang et al. |

FOREIGN PATENT DOCUMENTS

| | | |
|---|---|---|
| CN | 1818012 A | 8/2006 |
| CN | 103547858 A | 1/2014 |
| CN | 103615677 A | 3/2014 |
| CN | 103904197 A | 7/2014 |
| CN | 104781942 A | 7/2015 |
| CN | 102439682 B | 3/2016 |
| CN | 103717701 B | 8/2016 |
| CN | 205542866 U | 8/2016 |
| CN | 207350041 U | 5/2018 |
| CN | 108561764 A | 9/2018 |
| CN | 207906894 U | 9/2018 |
| CN | 208871526 U | 5/2019 |
| CN | 209196573 U | 8/2019 |
| CN | 110234926 A | 9/2019 |
| CN | 110388612 A | 10/2019 |
| CN | 209558063 U | 10/2019 |
| CN | 111279763 A | 6/2020 |
| CN | 111615753 A | 9/2020 |
| DE | 102016105211 A1 | 9/2017 |
| EP | 2629341 A1 | 8/2013 |
| EP | 2747157 B1 | 3/2016 |
| EP | 3226313 A1 | 10/2017 |
| EP | 3279952 A1 | 2/2018 |
| EP | 3568630 A1 | 11/2019 |
| JP | 2011129661 A | 6/2011 |
| JP | 2016042579 A | 3/2016 |
| JP | 2016076699 A | 5/2016 |
| JP | 2017520917 A | 7/2017 |
| JP | 2018056552 A | 4/2018 |
| JP | 2018113411 A | 7/2018 |
| JP | 2016072614 B | 5/2019 |
| KR | 101683270 B1 | 12/2016 |
| TW | 201306318 A | 2/2013 |
| TW | M467186 U | 12/2013 |
| TW | 201510440 A | 3/2015 |
| TW | I730680 B | 6/2021 |
| WO | 2008044171 A2 | 4/2008 |
| WO | 2010053341 A1 | 5/2010 |
| WO | 2011138707 A1 | 11/2011 |
| WO | 2015015363 A1 | 2/2015 |
| WO | 2017044380 A1 | 3/2017 |
| WO | 2017062314 A1 | 4/2017 |
| WO | 2018132778 A1 | 7/2018 |
| WO | 2019005597 A1 | 1/2019 |
| WO | 2019118959 A1 | 6/2019 |
| WO | 2020015420 A1 | 1/2020 |
| WO | PCTUS2023095 | 3/2020 |
| WO | 2020190921 A1 | 9/2020 |
| WO | 2020190960 A9 | 10/2020 |

OTHER PUBLICATIONS

Office Action Mar. 18, 2020; CN app. No. 201880007010.4.
European Search Opinion, Jul. 2020, EP18738546.
International Search Report, PCT/US2018/038928.
International Search Report, PCT/US2020/023095.
International Search Report, PCT/US2020/023110.
International Search Report, PCT/US2020/023187.
IPRP, PCT/US2018/065952.
Office Action, Apr. 2021; EP18738546.
Office Action, CN 202080035454.6, Sep. 2023.
Office Action, CN 202080036613, Sep. 2023.
Office Action, CN201880086608; Mar. 2023.
Office Action, JP2023-035861, Nov. 14, 2023.
Office Action, TW109109012, Jan. 2021.
Office Action, TW109109069, Oct. 30, 2020.
Supplementary European Search Report, Jul. 2020, EP18738546.
TW Office Action, Oct. 2020, App. No. 109109011.
Written Opinion, PCT/US2018/038928.
Written Opinion, PCT/US2018/065952.
Written Opinion, PCT/US2020/023095.
Written Opinion, PCT/US2020/023110.
Written Opinion, PCT/US2020/023187.
DuPont: Polymers, Light and the Science of TiO2; 2007.
DuPont: Titanium Dioxide for Coatings; 2007.
Johnson, Robert W., et al.; Light-scattering efficiency of white pigments: an analysis of model core-shell pigments vs. optimized rutile TiO2; TAPPI Journal, vol. 80: No. 11; Nov. 1997.
Office Action, CN202080035977, Jul. 2024.
Ross, William D.; Theoretical Light-Scattering Power of TiO2 and Microvoids; Ind. Eng. Chem., Prod. Res. Develop., vol. 13, No. 1, 1974.
Thiele, Erik S. and French, Roger H.; Computation of Light Scattering by Anisotropic Spheres of Rutile Titania; Adv. Mater. 1998, 10, No. 15 (1998).
Thiele, Erik S. and French, Roger H.; Light-Scattering Properties of Representative, Morphological Rutile Titania Particles Studied Using a Finite-Element Method, J. Am. Ceram. Soc., 81 [3] 469-479 (1998).

* cited by examiner

SECTION A-A

SECTION B-B

SECTION C-C

SECTION C-C

SECTION C-C ns of the light emission does not change; that is, it remains substantially constant and only the intensity varies. By contrast—for an incandescent lamp—the CCT can change from a warm white (2700 K) at full power to a warm orange glow (900 K) when fully dimmed; a range of 1800K. The characteristic of a light emitting device whose color temperature of emitted light decreases on dimming is referred to "warm dimming". Warm dimming would be highly desirable for many applications, especially for LED-filaments. To implement an LED-filament that exhibits warm dimming requires color/color temperature tunable LED-filaments.

WARM DIMMING LED-FILAMENTS AND LED-FILAMENT LAMPS

CROSS REFERENCE TO RELATED APPLICATIONS

This application is a continuation of U.S. patent application Ser. No. 17/718,746 (US publication no. 2022/0246586), filed Apr. 12, 2022; which in turn is a continuation of U.S. patent application Ser. No. 17/477,499, filed Sep. 16, 2021; which in turn is a bypass continuation-in-part of International Patent application PCT/US2020/023187 (publication no. WO2020/100960), filed Mar. 17, 2020; which in turn claims priority to (a) U.S. provisional patent application Ser. No. 62/820,249, filed Mar. 18, 2019; (b) U.S. provisional patent application Ser. No. 62/831,699, filed Apr. 9, 2019; (c) U.S. utility patent application Ser. No. 16/540,019 (now U.S. Pat. No. 11,342,311), filed Aug. 13, 2019, (d) U.S. provisional patent application Ser. No. 62/941,735, filed Nov. 28, 2019; and (e) U.S. provisional patent application Ser. No. 62/941,734, filed Nov. 28, 2019; all of which are hereby incorporated by reference in their entirety.

FIELD OF THE INVENTION

Embodiments of the present invention are directed to tunable/dimmable LED-filaments and tunable/dimmable LED-filament lamps. In particular, although not exclusively, embodiments concern warm dimming LED-Filament lamps.

BACKGROUND OF THE INVENTION

White light emitting LEDs ("white LEDs") include one or more photoluminescence materials (typically inorganic phosphor materials), which absorb a portion of the blue light emitted by the LED and re-emit light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lm/W and higher), white LEDs are rapidly being used to replace conventional fluorescent, compact fluorescent and incandescent lamps.

Recently, LED-filament lamps have been developed comprising LED-filaments whose visual appearance closely resembles the filament of a traditional incandescent lamp. Such an appearance is highly desirable to consumers and sales of LED-filament lamps have grown rapidly. The LED-filaments, which are typically about 2 inches (52 mm) long, comprise COG (Chip-On-Glass) or COC (Chip-On-Ceramic) devices having a plurality of low-power LED chips mounted on one face of a light-transmissive (transparent) glass or ceramic substrate. Front and back faces of the light-transmissive substrate are coated with a phosphor-loaded encapsulant, such as silicone. Typically, the phosphor comprises a mixture of green and red-light emitting phosphors for generating warm white light and to increase General Color Rendering Index (CRI Ra) of light generated by the filament. The same phosphor-loaded encapsulant is applied to both faces of the substrate to ensure that the filament generates the same color of light in forward and backward directions.

A perceived shortcoming or characteristic of white LEDs, especially LED-filaments and LED-filament lamps, compared with traditional incandescent bulbs, is that as they are dimmed (i.e., the intensity of generated light decreased by decreasing power to the device) the color temperature (CCT—Correlated Color Temperature) of their light emission does not change; that is, it remains substantially constant and only the intensity varies. By contrast—for an incandescent lamp—the CCT can change from a warm white (2700 K) at full power to a warm orange glow (900 K) when fully dimmed; a range of 1800K. The characteristic of a light emitting device whose color temperature of emitted light decreases on dimming is referred to "warm dimming". Warm dimming would be highly desirable for many applications, especially for LED-filaments. To implement an LED-filament that exhibits warm dimming requires color/color temperature tunable LED-filaments.

Color temperature tunable white LED lamps, for example LED bulbs and downlights, are known to comprise a combination of "cool white" and "warm white" packaged white LEDs enabling tuning between cool white and warm white and CCTs in between. To achieve a uniform color of emitted light requires adequate mixing of the light of different color temperatures and LED bulbs/downlights include a diffuser. In contrast, for an LED-filament lamp that includes LED-filaments of different CCTs the LED-filaments are spaced apart too far to achieve adequate mixing. While it is possible that the bulb envelope could include a diffuser, such a feature is undesirable since it would prevent viewing of the LED-filaments that reduce visual appeal of LED—the filament lamp. Without a diffuser the different color temperature LED-filaments would be clearly visible and this would further degrade the appearance of the lamp.

It is an object of the present invention to provide a tunable LED-filament that at least in part addresses the limitations of known LED-filaments and whose emitted light is color/color temperature tunable. Moreover, it is desirable to provide an LED-filament that exhibits warm dimming.

SUMMARY OF THE INVENTION

Embodiments of the invention concern LED-filaments comprising two arrays of LED chips (LED arrays) on the same substrate that are configured, through the use of photoluminescence material arrangements, to generate light of two different colors/color temperatures.

In accordance with embodiments of the invention, an LED lamp that generates light of a color temperature that decreases with decreasing power applied to the LED lamp may include at least one lighting arrangement that may include a first LED array of serially connected first LED chips, a second LED array of serially connected second LED chips; a first photoluminescence layer covering the first LED array for generating light of a first color temperature; a second photoluminescence layer covering the second LED array for generating light of a second different color temperature; and a linear resistor serially connected to the first LED array, wherein the first LED array and second LED array are connected in parallel.

In accordance with embodiments of the invention an LED-filament may include a light-transmissive substrate; a first array of LED chips on a front face of the substrate; a second array of LED chips on the front face of the substrate; a first photoluminescence arrangement covering the first array of LED chips; and a second photoluminescence arrangement covering the second array of LED chips; wherein the first array of LED chips and the first arrangement generate light of a first color temperature and the second array of LED chips and the second arrangement generate light of a second color temperature.

It may be that the first color temperature is 1500K to 3500K and the second color temperature is 3500K to 7500K. Such a range of color temperature tuning is highly desirable for general lighting.

Alternatively, it may be the first color temperature is 1800K to 2500K, and the second color temperature is 3000K to 4000K. Such a range of color temperature tuning is highly desirable for "warm dimming".

In one embodiment the first arrangement comprises a first layer having a first photoluminescence material disposed on the first array of LED chips and the second arrangement comprises a second layer having a second photoluminescence material disposed on the second array of LED chips. A particular advantage of such an LED-filament comprising only two photoluminescence layers to generate the first and second color temperatures of light is ease of fabrication. Since the LED-filament is manufactured with the first and second array of LED chips mounted on the same substrate, this enhances the robustness of the LED-filament and reduces the likelihood of error during manufacturing since there are fewer parts to be assembled compared with an LED-filament having, for example, two substrates each having its own respective array of LED chips.

The LED-filament can comprise a diffusing layer comprising particles of light scattering material wherein the diffusing layer is disposed on the first and second layers. Such a diffusing layer can improve mixing of light of the first and second color temperatures improving the color uniformity of the light generated by the LED-filament.

It may be that the first photoluminescence material comprises a red photoluminescence material and the first arrangement further comprises a third layer having a third photoluminescence material disposed on the first layer. A particular advantage of locating the red photoluminescence material in a separate respective layer is that this can reduce the usage of such materials. This can provide a substantial cost saving when using expensive narrowband red photoluminescence materials such as $K_2SiF_6:Mn^{4+}$, $K_2GeF_6:Mn^{4+}$, and $K_2TiF_6:Mn^{4+}$.

Similarly, the second photoluminescence material may comprise a red photoluminescence material and the second arrangement further comprises a fourth layer having a fourth photoluminescence material disposed on the second layer. Again, a particular advantage of locating the red photoluminescence material in a separate respective layer is that this can reduce the usage of such materials. This can provide a substantial cost saving when using expensive narrowband red photoluminescence materials such as $K_2SiF_6:Mn^{4+}$, $K_2GeF_6:Mn^{4+}$, and $K_2TiF_6:Mn^{4+}$.

Embodiments in which the third and fourth layers comprise red photoluminescence materials can find particular utility when light of the first and second color temperatures are similar (<1500K difference), especially lower (warmer), color temperatures, e.g. "warm white" to "amber" and cooler "warm white" thereby enabling the LED-filament to be tunable between "amber" and "warm white". Such a range of color tuning is highly desirable for "warm dimming".

To ensure the front and back faces of the LED-filament generate light of similar color temperatures the LED-filament may comprise a fifth layer having a fifth photoluminescence material disposed on a back face of the substrate and positionally in correspondence with the first array of LED chips, and a sixth layer comprising a sixth photoluminescence material disposed on a back face of the substrate and positionally in correspondence with the second array of LED chips. The fifth photoluminescence materials can be configured such that the LED-filament emits light from its back face of the first color temperature and the sixth photoluminescence can be configured such that the LED-filament emits light from its back face of the second color temperature.

In other embodiments the LED-filament may comprise: a first layer having a first photoluminescence material disposed on the first array of LED chips and a second layer having a second photoluminescence material disposed on the first layer and the second array of LED chips, wherein the first arrangement comprises the first and second first photoluminescence materials and the second arrangement comprises substantially the second photoluminescence material. In such arrangement the second layer covers both the first and second arrays of LED chips and light of the first color temperature is generated by the combination of the first and second photoluminescence materials of the first and second layers and light of the second color temperature is generated by the first photoluminescence material. A particular advantage of such an LED-filament comprising only two photoluminescence layers to generate the first and second color temperatures of light is ease of fabrication. Moreover, since the second layer covers the first layer this can improve mixing of light and improve color uniformity of emitted light. In such an arrangement, it may be that the first layer comprises a majority of orange to red photoluminescence material.

To ensure the front and back faces of the LED-filament generate light of similar color temperatures the LED-filament may comprise a third layer having a third photoluminescence material disposed on the back face of the substrate. The third photoluminescence material can be configured to generate light of a color temperature that is between the first and second color temperature when both arrays of LED chips are activated.

In any embodiment at least one of said layers comprises particles of a light scattering material. The inclusion of light scattering particles can reduce photoluminescence material usage and improve light color uniformity.

In any embodiment at least one of said photoluminescence materials can comprise green to yellow photoluminescence materials, narrowband red photoluminescence materials, broadband orange to red photoluminescence materials and combinations thereof.

The narrowband red photoluminescence material can be at least one of: $K_2SiF_6:Mn^{4+}$, $K_2GeF_6:Mn^{4+}$, and $K_2TiF_6:Mn^{4+}$. The broadband orange to red photoluminescence material can comprise a rare-earth-activated red photoluminescence material. The rare-earth-activated orange to red photoluminescence material can be at least one of: a nitride-based phosphor material having a general composition $AAlSiN_3:Eu^{2+}$ where A is at least one of Ca, Sr or Ba; a sulfur-based phosphor material having a general composition $(Ca_{1-x}Sr_x)(Se_{1-y}S_y):Eu^{2+}$ where $0 \le x \le 1$ and $0 < y \le 1$; and a silicate-based phosphor material having a general composition $(Ba_{1-x}Sr_x)_3SiO_5:Eu^{2+}$ where $0 \le x \le 1$.

The orange to red photoluminescence material can comprise a narrowband red photoluminescence material or a broadband red photoluminescence material and combinations thereof. The narrowband red photoluminescence material can be at least one of: $K_2SiF_6:Mn^{4+}$, $K_2GeF_6:Mn^{4+}$, and $K_2TiF_6:Mn^{4+}$. The broadband red photoluminescence material can comprise a rare-earth-activated red photoluminescence material. The rare-earth-activated orange to red photoluminescence material can be at least one of: a nitride-based phosphor material having a general composition $AAlSiN_3:Eu^{2+}$ where A is at least one of Ca, Sr or Ba; a sulfur-based phosphor material having a general composition $(Ca_{1-x}Sr_x)(Se_{1-y}S_y):Eu^{2+}$ where $0 \leq x < 1$ and $0 \leq y \leq 1$; and a silicate-based phosphor material having a general composition $(Ba_{1-x}Sr_x)_3SiO_5:Eu^{2+}$ where $0 \leq x \leq 1$.

In embodiments, the first and second arrays of LED chips each respectively comprise a linear array of serially electrically connected LED chips. The LED-filament may further comprise a resistive component connected in series with the first array of LED chips and wherein the first and second arrays are electrically connected in parallel. It may be that the first array of LED chips comprises fewer LED chips than the second array of LED chips. Such a circuit arrangement allows the LED-filament to exhibit "warm dimming".

It may be that the substrate has a transmittance of from 2% to 70%.

According to other embodiments a warm dimming LED lamp for generating light of a color temperature that decreases with decreasing power applied to the LED lamp may comprise: at least one lighting arrangement comprising: a first LED array of serially connected first LED chips; a second LED array of serially connected second LED chips; a first photoluminescence layer covering the first LED array for generating light of a first color temperature; a second photoluminescence layer covering the second LED array for generating light of a second different color temperature; and a linear resistor serially connected to the first LED array, wherein the first LED array and second LED array are connected in parallel.

It may be that a proportion of current flowing through the first LED array compared with a proportion of current flowing through the second LED array depends on the power applied to the LED lamp.

It may be that at a maximum operating power, current passes through both the first and second LED arrays and a color temperature of light generated by the LED lamp is between the first and second color temperatures; and at a minimum operating power, a majority of current flows through the first LED array and a color temperature of light generated by the LED lamp is substantially the first color temperature.

It may be that at the maximum operating power, at least 50% of the current flows through the second LED array.

In embodiments a number of first LED chips, a number of second LED chips, and the resistance of the linear resistor are configured such that a current/voltage characteristic (I-V) of the first LED array increases substantially linearly with increasing voltage and a current/voltage characteristic (I-V) of the second LED array increases generally exponentially with increasing voltage.

It may be that the first LED array comprises fewer LED chips than the second LED array.

In embodiments the first photoluminescence layer covers each of the first LED chips, and the second photoluminescence layer covers each of the second LED chips. The second photoluminescence layer may additionally cover the first photoluminescence layer.

The first photoluminescence layer may comprise a narrowband red phosphor selected from the group consisting of: $K_2SiF_6:Mn^{4+}$, $K_2GeF_6:Mn^{4+}$, and $K_2TiF_6:Mn^{4+}$.

It may be that the first color temperature is from 1800K to 2500K, and the second color temperature is from 3000K to 4000K.

The LED lamp may comprise at least two lighting arrangements. The LED lamp may comprise a connector base for applying power to the at least two lighting arrangements. The LED lamp may further comprises a light transmissive envelope enclosing the at least two lighting arrangements.

In embodiments, the lighting arrangement may comprising an at least partially light transmissive substrate on which the first LED array and the second LED arrays are mounted.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, in which.

DETAILED DESCRIPTION OF THE INVENTION

Figure 1A:
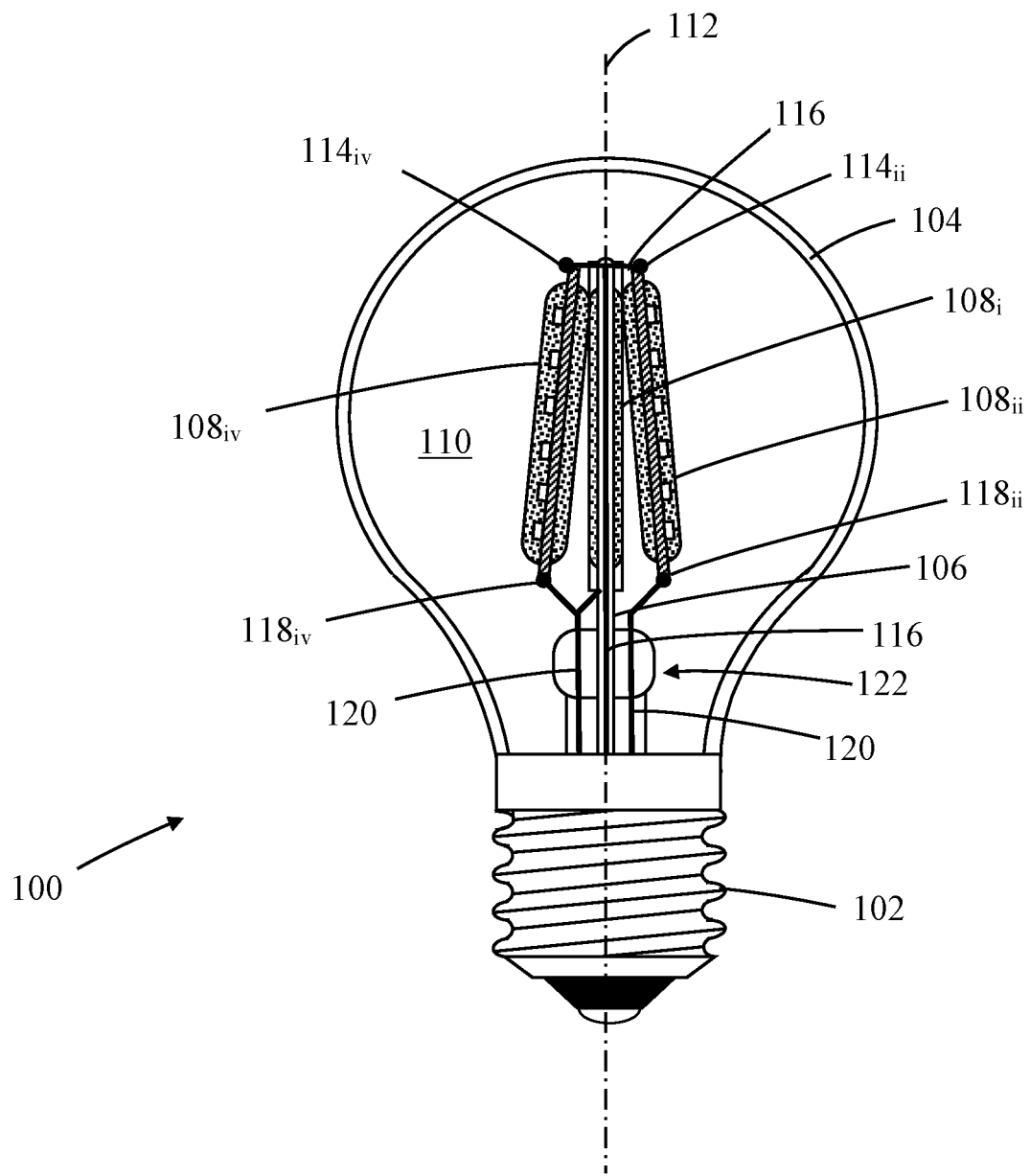
FIGS. 1A and 1B respectively illustrate partial cross-sectional A-A side and plan views of a four LED-filament A-Series (A19) lamp in accordance with an embodiment of the invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. Throughout this specification, like reference numerals preceded by the figure number are used to denote like parts.

Figure 1B:
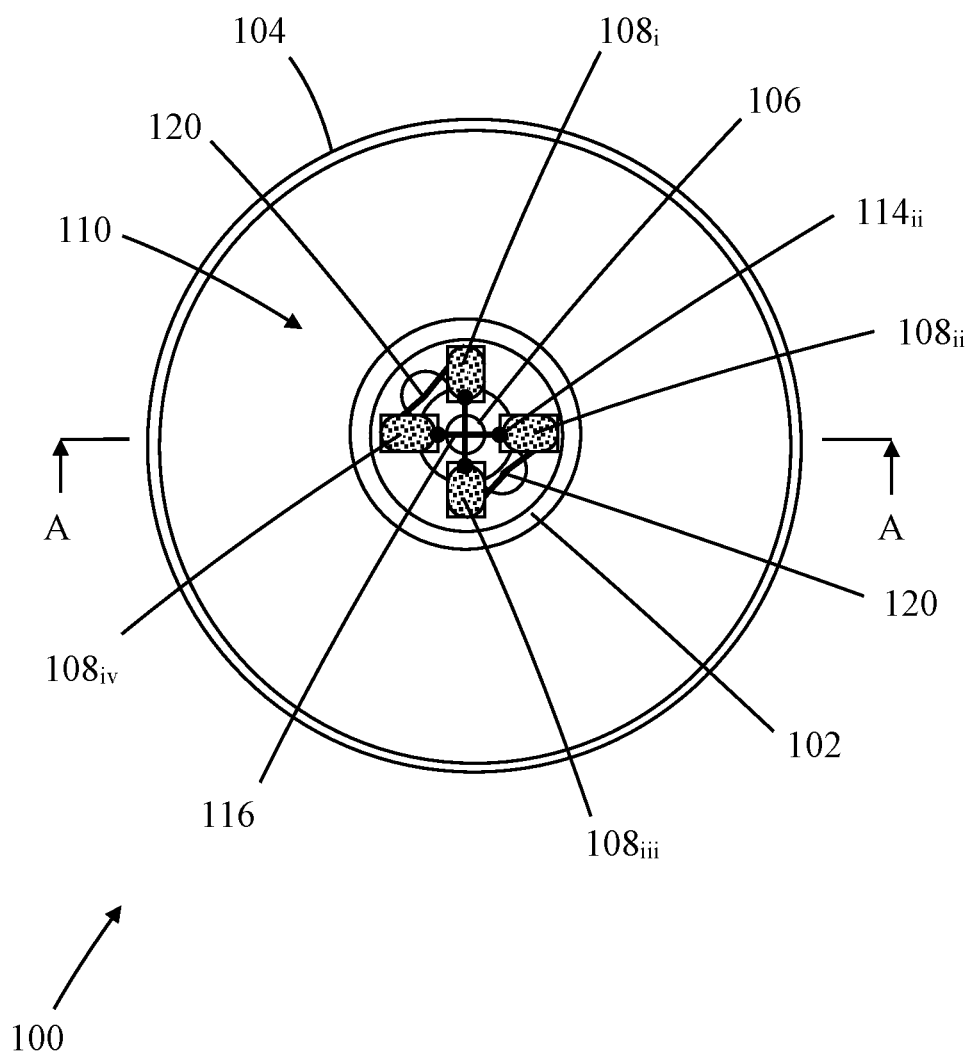

FIGS. 1A and 1B respectively illustrate a partial cross-sectional side view through A-A and a partial cutaway plan view of an LED-filament A-Series lamp (bulb) 100 formed in accordance with an embodiment of the invention. The LED-filament lamp (bulb) 100 is intended to be an energy efficient replacement for a traditional incandescent A19 light bulb and can be configured to generate 550 lm of light with a CCT of 2700 K and a general color rendering index CRI Ra of at least 80. The LED-filament lamp is nominally rated at 4 W. As is known, an A-series lamp is the most common lamp type and an A19 lamp is 2⅜ inches (19/8 inches) wide at its widest point and approximately 4⅜ inches in length.

LED-filament lamp 100 comprises a connector base 102, a light-transmissive envelope 104; an LED-filament support 106 and four tunable LED-filaments $108_i$, $108_{ii}$, $108_{iii}$, $108_{iv}$.

In some embodiments, the LED-filament lamp 100 can be configured for operation with a 110V (r.m.s.) AC (60 Hz) mains power supply as used in North America. For example, and as illustrated, the LED-filament lamp 100 can comprise an E26 (φ26 mm) connector base (Edison screw lamp base) 102 enabling the lamp to be directly connected to a mains power supply using a standard electrical lighting screw socket. It will be appreciated that depending on the intended application other connector bases can be used such as, for example, a double contact bayonet connector (i.e. B22d or BC) as is commonly used in the United Kingdom, Ireland, Australia, New Zealand and various parts of the British Commonwealth or an E27 (φ27 mm) screw base (Edison screw lamp base) as used in Europe. The connector base 102 can house rectifier or other driver circuitry (not shown) for operating the LED-filament lamp.

The light-transmissive envelope 104 is attached to the connector 102. The light-transmissive envelope 104 and LED-filament support 106 can comprise glass. Envelope 104 defines a hermetically sealed volume 110 in which the LED-filaments $108_i$ to $108_{iv}$ are located. The envelope 104 may additionally incorporate or include a layer of a light diffusive (scattering) material such as for example particles of zinc oxide (ZnO), titanium dioxide ($TiO_2$), barium sulfate ($BaSO_4$), magnesium oxide (MgO), silicon dioxide ($SiO_2$) or aluminum oxide ($Al_2O_3$).

The LED-filaments $108_i$ to $108_{iv}$, which are linear (strip or elongate) in form, are oriented such that their direction of elongation is generally parallel to an axis 112 of the lamp 100. In this embodiment, the LED-filaments $108_i$ to $108_{iv}$ are equally circumferentially spaced around the glass filament support 106 (FIG. 1B), although it will be appreciated that in other embodiments the LED-filaments may not be equally spaced around the glass support. A first electrical contact $114_i$ to $114_{iv}$ on a first end of each respective LED-filament $108_i$ to $108_{iv}$ distal to the connector base 102 is electrically and mechanically connected to a first conducting wire 116 that passes down an axis of the LED filament support 106 to the connector base 102. A second electrical contact $118_i$ to $118_{iv}$ on a second end of each LED-filament $108_i$ to $108_{iv}$ proximal to the connector base 102 is electrically and mechanically connected to a second conducting wire 120 that passes through a base portion 122 of the LED filament support 106 to the connector base 102. As illustrated, the LED filaments 1081 to 1081, can be electrically connected in parallel.

As described above, tunable LED-filaments in accordance with embodiments of the invention comprise two arrays of LED chips (LED arrays) on the same substrate that are configured, through the use of photoluminescence materials of various structures, to generate light of two different colors/color temperatures. In this specification, the first array of LEDs generates light of a first color temperature, and the second array of LED chips generates light of a second higher color temperature (i.e., cooler color).

Figure 2A:
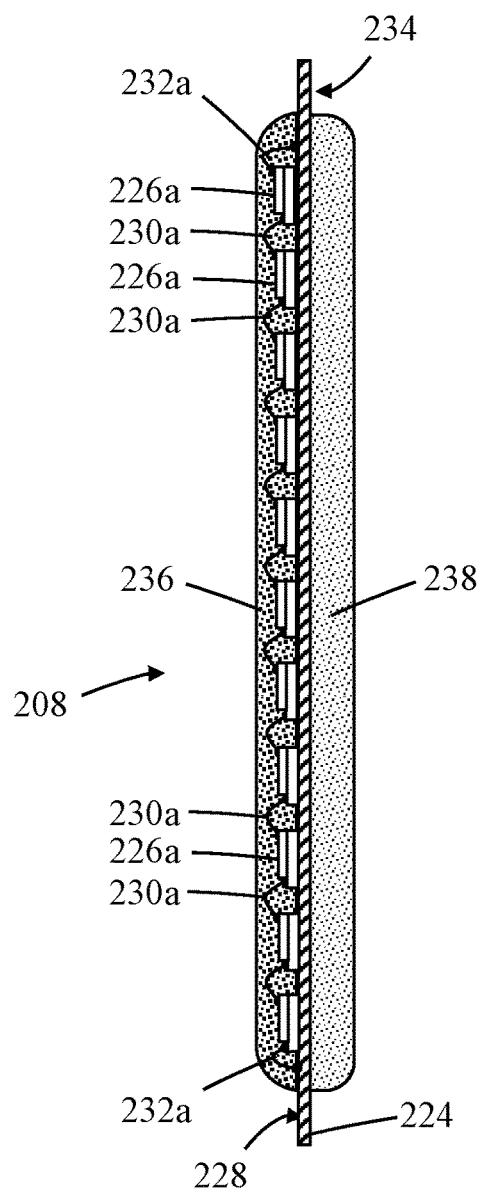
FIGS. 2A and 2B respectively illustrate schematic cross-sectional side B-B and partial cutaway plan of color temperature tunable LED-filaments in accordance with embodiments of the invention for use in the lamp of FIGS. 1A and 1B.
Figure 2B:
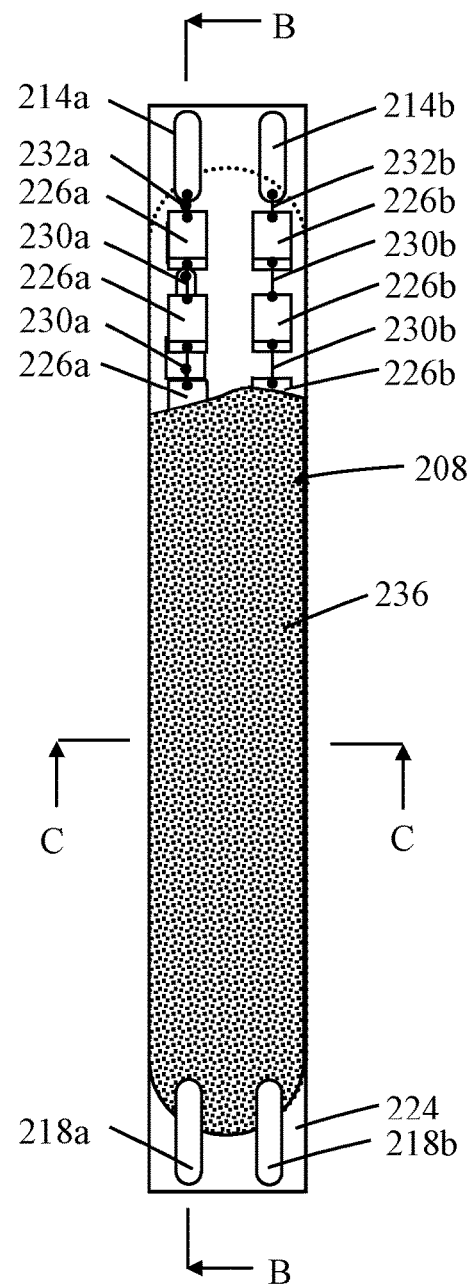

A tunable LED-filament according to an embodiment of the invention is now described with reference to FIGS. 2A and 2B which respectively show a cross-sectional side view through B-B, a partial cut-away plan and a partial cutaway plan view of a tunable LED-filament 208 in accordance embodiments of the invention.

LED-filament 208 comprises a light-transmissive substrate 224 having first and second arrays (plurality) of blue emitting (465 nm) unpackaged LED chips (dies) 226a, 226b mounted directly to a front (first) face 228. For the sake of brevity, the first and second arrays of LED chips will respectively be referred to as first and second LED arrays. In this specification, the suffixes a and b are used to indicate the LED array and features (e.g., photoluminescence material layers, contacts, etc.) respectively associated with the array of LED chips. Typically, each LED-filament has a total nominal power of about 0.7 W to 1 W.

The substrate 224 can further comprise respective electrical first and second contacts 214a, 214b, 218a, 218b on the front face 228 at the first and second ends of the substrate 224 for electrical connection to a respective one of the conducting wires 116, 120 (FIG. 1A) to provide electrical power to operate the LED-filament. The electrical contacts 214a, 214b, 218a, 218b can comprise copper, silver or other metal or a transparent electrical conductor such as indium tin oxide (ITO). In the embodiment, illustrated the substrate 224 is planar and has an elongate form (strip) with the arrays of LED chips 226a, 226b are configured as linear arrays (string) and equally spaced along the length (direction of elongation) of the substrate. As indicated in FIGS. 2A and 2B the LED chips 226a, 226b can be electrically connected in series by respective bond wires 230a, 230b between adjacent the LED chips of the string and bond wires 232a, 232b between the LED chips at the distal ends of the substrate and their respective electrical contact 214a, 214b, 218a, 218b.

When the LED-filament 208 is used as a part of an energy efficient bulb, an elongate configuration is typically preferred since the appearance and emission characteristics of the device more closely resembles a traditional filament of an incandescent bulb. It should be noted that the LED chips 226a, 226b are unpackaged and emit light from both their top and bottom (base) faces with the base surface of the LED chip mounted directly on substrate 224.

The light-transmissive substrate 224 can comprise any material which is light-transmissive and can have a transmittance to visible light from 2% to 70% (reflectance of 98% to 30%). The substrate can comprise a glass, ceramic material or a plastics material such as polypropylene, silicone or acrylic. In embodiments, the light-transmissive substrate can comprise a porous ceramic substrate composed of alumina that has a transmittance of about 40%. To aid in the dissipation of heat generated by the LED chips 226a, 226b, the substrate 224 can not only be light-transmissive but can also be thermally conductive to aid in the dissipation of heat generated by the LED chips. Examples of suitable light-transmissive thermally conductive materials include magnesium oxide, sapphire, aluminum oxide, quartz glass, and diamond. The transmittance of the thermally conductive substrate can be increased by making the substrate thin. To increase mechanical strength, the substrate can comprise a laminated structure with the thermally conductive layer mounted on a light-transmissive support such as a glass or plastics material. To further assist in the dissipation of heat, volume 110 (FIG. 1A) within glass envelope 104 (FIG. 1A) can be filled with a thermally conductive gas such as helium, hydrogen or a mixture thereof.

The LED-filament 208 further comprises a photoluminescence wavelength conversion coating (layer) 236 applied to/disposed on and covering the front face 228 of the substrate 224 and may optionally comprise a photoluminescence wavelength conversion coating 238 applied to and covering/disposed on the second/back (opposite) face 234 of the substrate 224.

In accordance with embodiments of the invention the photoluminescence coating 236 comprises a first photoluminescence material arrangement (structure) that covers the first LED array 226a and a second photoluminescence material arrangement that covers the second LED array 226b. The first array of LED chips in combination with the first photoluminescence arrangement are configured to generate light of a first color temperature and the second array of LED chips in combination with the second photoluminescence arrangement are configured to generate light of a second cooler color temperature. The photoluminescence conversion materials can comprise one or more green to yellow photoluminescence materials having a peak emission wavelength ranging from 520 nm to 560 nm (preferably 540 nm to 545 nm), one or more orange to red photoluminescence materials having a peak emission wavelength ranging from 620 nm to 650 nm and combinations thereof. Suitable green to yellow photoluminescence materials and orange to red photoluminescence materials are discussed below.

Various photoluminescence arrangements (structures) for the front and back faces of the substrate are now described by way of reference to FIGS. 3 to 6.

Figure 3:
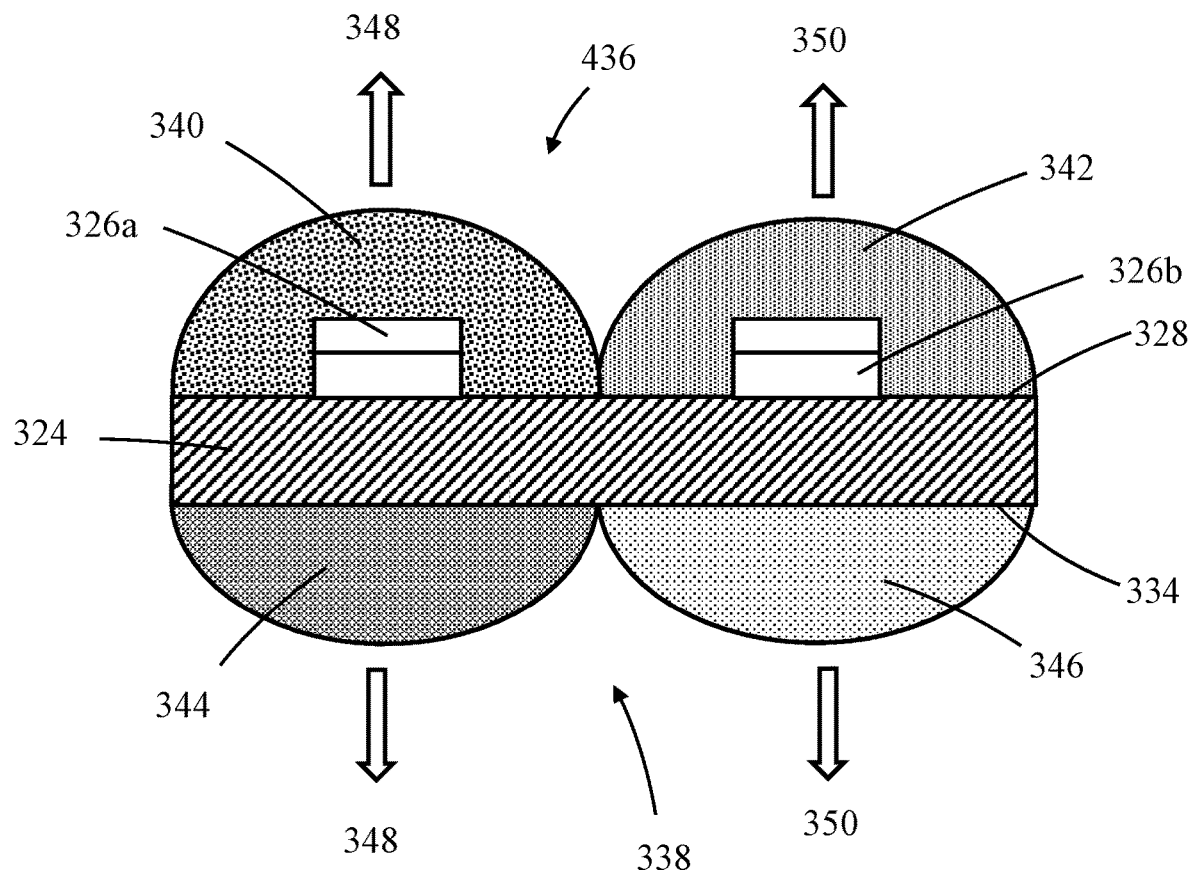
FIGS. 3 and 4 are schematic cross-sectional end views C-C of color temperature tunable LED-filaments in accordance with embodiments of the invention comprising "single-layer" photoluminescence arrangements.

FIG. 3 is a schematic cross-sectional end view C-C of a color temperature tunable LED-filament 308 in accordance with an embodiment of the invention comprising "single-layer" photoluminescence arrangements. In the embodiment illustrated in FIG. 3, the first photoluminescence arrangement covering the first array of LED chips 326a comprises: a photoluminescence layer 340 comprising a first photoluminescence material disposed on the first LED array 326a and the second photoluminescence arrangement covering the second array of LED chips 326b comprises: a photoluminescence layer 342 comprising a second photoluminescence material disposed on the second LED array 326b.

Since the first and second photoluminescence arrangements each comprise a single photoluminescence layer such structures will be referred to as a single-layer structure.

The photoluminescence coating 338 covering the back face 334 of the substrate 324 comprises a photoluminescence layer 344 comprising a third photoluminescence material and a photoluminescence layer 346 comprising a fourth photoluminescence material. As illustrated, the photoluminescence layer 344, containing the third photoluminescence material, is disposed on and covers a part of the substrate 324 positionally in correspondence with the first LED array 326a and the photoluminescence layer 346, containing the fourth photoluminescence material, is disposed on and covers a part of the substrate 324 positionally in correspondence with the second LED array 326b.

The first and third photoluminescence materials are selected such that when excited by blue light from the first LED array 326a they generate green to red light which in combination with unconverted blue excitation light generates a combined light emission 348 of the first color temperature. Typically, the first and third photoluminescence materials will be compositionally very similar.

The second and fourth photoluminescence materials are selected such that when excited by blue light from the second LED array 326b they generate green to red light which in combination with unconverted blue excitation light generates a combined light emission 350 of the second cooler color temperature. Typically, the second and fourth photoluminescence materials will be compositionally very similar.

It will be appreciated that depending on the relative proportion of light generated by the first and second LED arrays the color temperature of the LED-filament can be tuned between the first and second color temperatures. Additionally, particles of a light scattering material can be combined with the photoluminescence materials to reduce the quantity of photoluminescence material required to generate a given emission product color.

The single-layer LED-filament of FIG. 3 can be manufactured by depositing the photoluminescence layer 340 onto the first array of LED chips 326a and then depositing the photoluminescence layer 342 onto the second array of LED chips 326b. Next, the photoluminescence layer 344 can be deposited the back face 334 of the substrate 324 to cover at least the part of the substrate 324 positionally in correspondence with the first LED array 326a and the photoluminescence layer 346 deposited on the back face 334 of the substrate 324 to cover at least the part of the substrate 324 positionally in correspondence with the second LED array 326b. A particular advantage of the structure of the photoluminescence structure of FIG. 3 is its ease of fabrication. As illustrated, the photoluminescence layers 340, 342, 344, 346 can have a cross section that is generally semi-circular in profile.

The LED-filament of FIG. 3 can find particular utility where it is required that the first and second LED arrays generate light of substantially different color temperatures (>1500K difference), e.g., "warm white" and "cool white" thereby enabling the LED-filament to be tunable between "warm white" and "cool white". For example, the photoluminescence composition of the photoluminescence layer 340 can configured such that the first LED array 326a in conjunction with the photoluminescence layer 340 generates white light of a first color temperature, for example "warm white" (e.g. CCT 1500K to 3500K), while the second LED array 326b in conjunction with the photoluminescence layer 342 generates white light of a second, higher, color temperature, for example "cool white" (e.g. CCT 3500K to 7500K).

Figure 4:
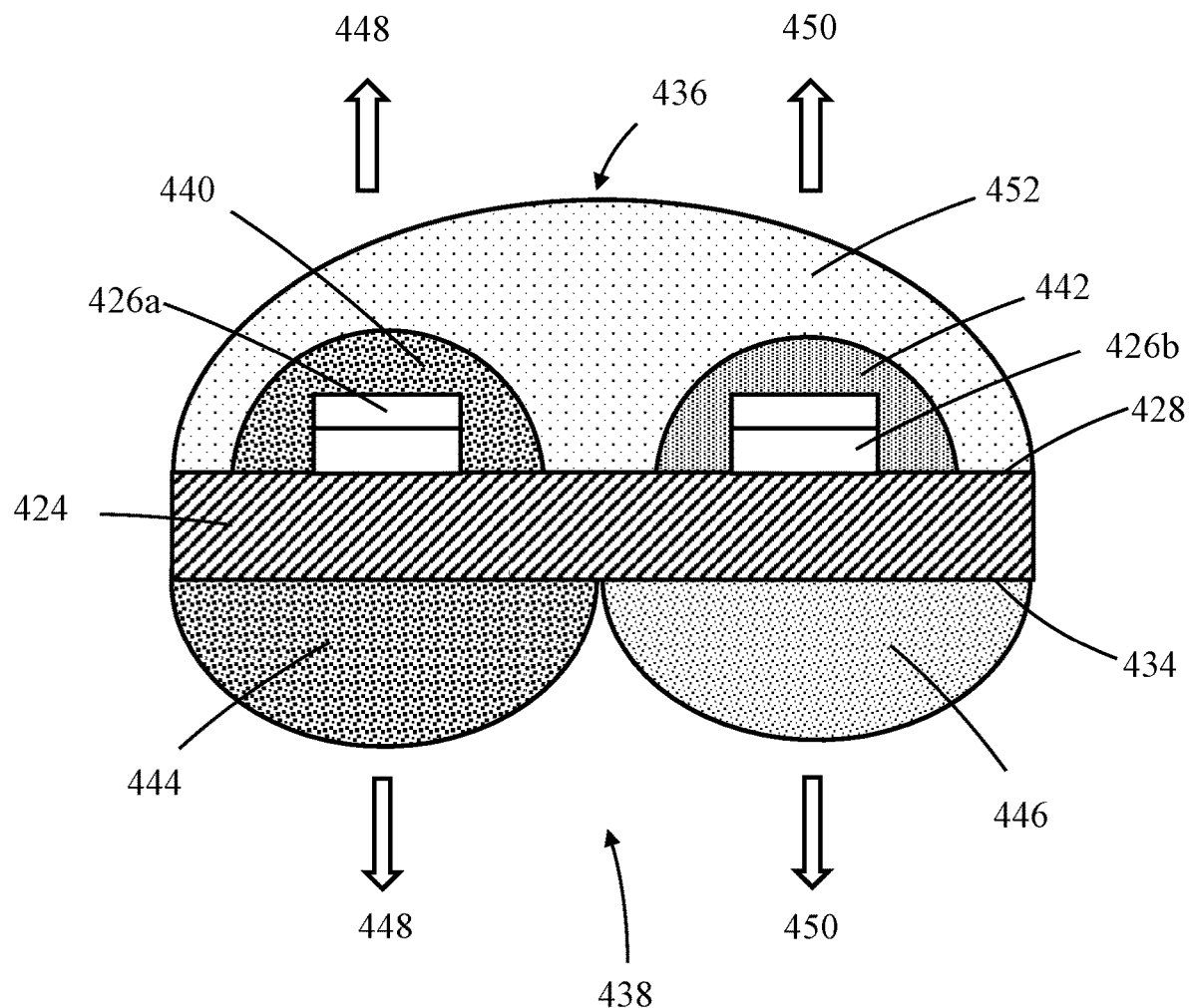

FIG. 4 is a schematic cross-sectional end view C-C of a color temperature tunable LED-filament 408 in accordance with an embodiment of the invention comprising "single-layer" photoluminescence arrangements. As with embodiment of FIG. 3, the first photoluminescence arrangement covering the first array of LED chips 426a comprises a photoluminescence layer 440 comprising a first photoluminescence material disposed on the first LED array 426a and the second photoluminescence arrangement covering the second array of LED chips 426b comprises a photoluminescence layer 442 comprising a second photoluminescence material disposed on the second LED array 426b. In this embodiment the LED-filament further comprises a light diffusing layer 452 comprising particles of light scattering material that is disposed on and covers the first and second layers 440, 442.

Photoluminescence coating 438 covering the back face 434 of the substrate 424 comprises a photoluminescence layer 444 comprising a third photoluminescence material and a photoluminescence layer 446 comprising a fourth photoluminescence material. As illustrated, the photoluminescence layer 444, containing the third photoluminescence material, is disposed on and covers a part of the substrate 424 positionally in correspondence with the first LED array 426a and the photoluminescence layer 446, containing the fourth photoluminescence material, is disposed on and covers a part of the substrate 424 positionally in correspondence with the second LED array 426b.

The first and third photoluminescence materials are selected such that when excited by blue light from the first LED array 426a they generate green to red light which in combination with unconverted blue excitation light generates a combined light emission 448 of the first color temperature. Typically, the first and third photoluminescence materials will be compositionally very similar.

The second and fourth photoluminescence materials are selected such that when excited by blue light from the second LED array 426b they generate green to red light which in combination with unconverted blue excitation light generates a combined light emission 450 of the second cooler color temperature. Typically, the second and fourth photoluminescence materials will be compositionally very similar.

It will be appreciated that depending on the relative proportion of light generated by the first and second LED arrays the color temperature of the LED-filament can be tuned between the first and second color temperatures. Additionally, particles of a light scattering material can be combined with the photoluminescence materials to reduce the quantity of photoluminescence material required to generate a given emission product color.

The single-layer LED-filament of FIG. 4 can be manufactured by depositing the photoluminescence layer 440 onto the first array of LED chips 426a, depositing the photoluminescence layer 442 onto the second array of LED chips 426b, and then depositing the light diffusing layer 452 onto to the first and second layers 440, 442. Next, the photoluminescence layer 444 can be deposited the back face 434 of the substrate 424 to cover at least the part of the substrate 424 positionally in correspondence with the first LED array 426a and the photoluminescence layer 446 deposited on the back face 434 of the substrate 424 to cover at least the part of the substrate 424 positionally in correspondence with the second LED array 426b. A particular advantage of the structure of the photoluminescence structure of FIG. 4 is its ease of fabrication. As illustrated, the photoluminescence layers 440, 442, 444, 446 can have a cross section that is generally semi-circular in profile.

Figure 5:
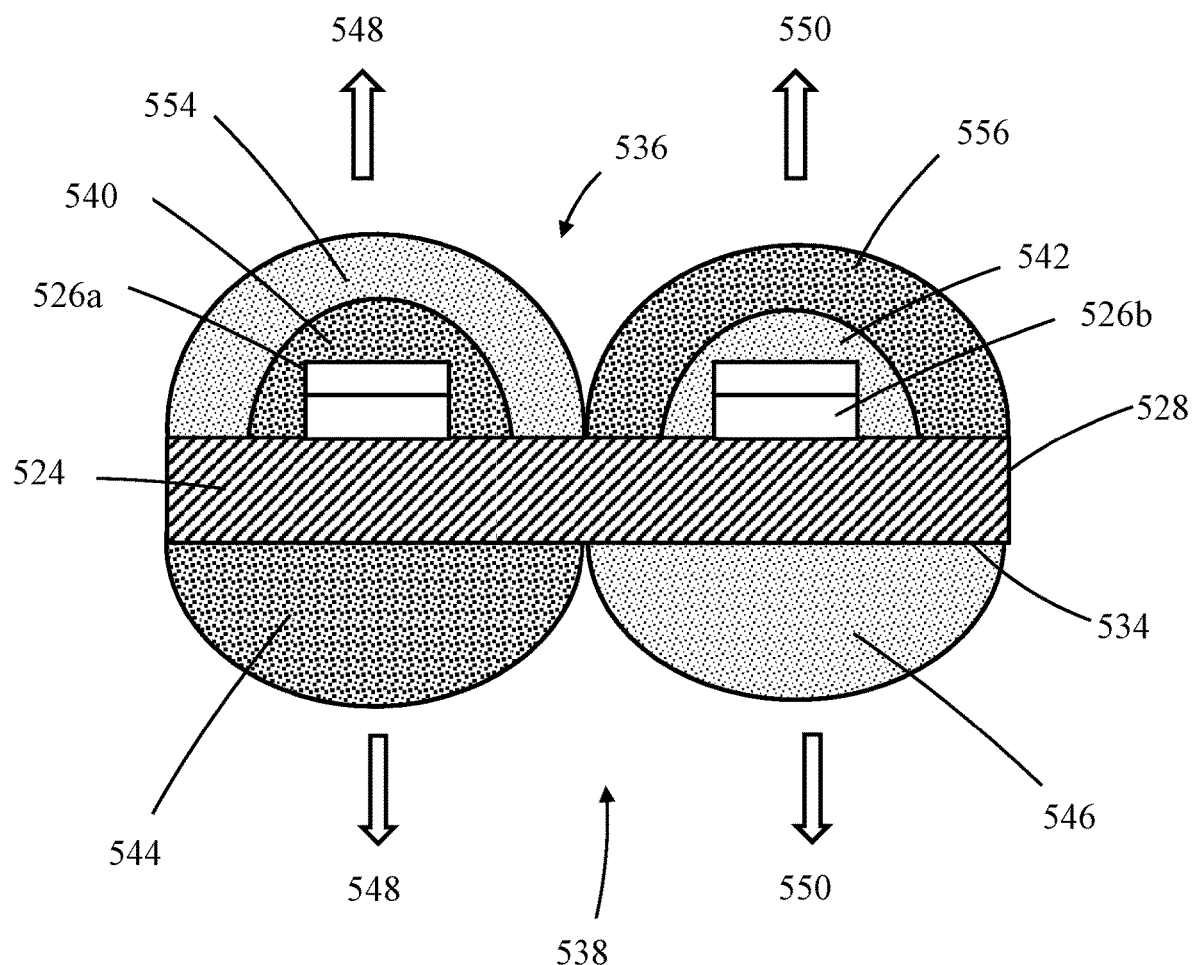
FIG. 5 is a schematic cross-sectional end view C-C of a color temperature tunable LED-filament in accordance with an embodiment of the invention comprising "double-layer" photoluminescence arrangements.

FIG. 5 is a schematic cross-sectional end view C-C of a color temperature tunable LED-filament 508 in accordance with an embodiment of the invention comprising a "double-layer" photoluminescence arrangement. In the embodiment illustrated in FIG. 5, the first and second photoluminescence arrangements each comprise a two layer, "double-layer" structure, covering their respective LED array. The first photoluminescence arrangement comprises: a photoluminescence layer 540 comprising a first photoluminescence material disposed on the first LED array 526a and a photoluminescence layer 554 comprising a second photoluminescence material disposed on and covering the photoluminescence layer 540. The second photoluminescence arrangement comprises: a photoluminescence layer 542 comprising a third photoluminescence material disposed on the second LED array 526b and a photoluminescence layer 556 comprising a fourth photoluminescence material disposed on and covering the photoluminescence layer 542 and LED array 526a and while the second photoluminescence arrangement covering the second array of LED chips 326b comprises a second photoluminescence layer 342.

The photoluminescence coating 538 covering the back face 534 of the substrate 524 comprises a photoluminescence layer 544 comprising a fifth photoluminescence material and a photoluminescence layer 546 comprising a sixth photoluminescence material. As illustrated, the photoluminescence layer 544, containing the fifth photoluminescence material, is disposed on and covers a part of the substrate 524 positionally in correspondence with the first LED array 526a and the photoluminescence layer 546, containing the sixth photoluminescence material, is disposed on and covers a part of the substrate 524 positionally in correspondence with the second LED array 426b.

The first and second photoluminescence materials on the front face of the LED-filament are selected such that when they are excited by blue light from the first LED array 526a they generate green to red light which in combination with unconverted blue excitation light generates a combined light emission 548 of the first color temperature. Typically, the first photoluminescence material comprises a red photoluminescence. A particular advantage of locating the red photoluminescence material in a separate respective layer 540, rather than as a mixture with the second photoluminescence in a single layer, is that this can reduce the usage of such materials. This can provide a substantial cost saving when using expensive narrowband red photoluminescence materials such as $K_2SiF_6:Mn^{4+}$, $K_2GeF_6:Mn^{4+}$, and $K_2TiF_6:Mn^{4+}$. The fifth photoluminescence material on the back face of the LED-filament is selected such that when excited by blue light from the first LED array 526a it generates green to red light which in combination with unconverted blue excitation light generates a combined light emission 548 of the first color temperature.

The third and fourth photoluminescence materials on the front face of the LED-filament are selected such that when they are excited by blue light from the second LED array 526b they generate green to red light which in combination with unconverted blue excitation light generates a combined light emission 550 of the second color temperature. Typically, the third photoluminescence material comprises a red photoluminescence. A particular advantage of locating the red photoluminescence material in a separate respective layer 542, rather than as a mixture with the fourth photoluminescence in a single layer, is that this can reduce the usage of such materials. This can provide a substantial cost saving when using expensive narrowband red photoluminescence materials such as $K_2SiF_6:Mn^{4+}$, $K_2GeF_6:Mn^{4+}$, and $K_2TiF_6:Mn^{4+}$. The sixth photoluminescence material on the back face of the LED-filament is selected such that when excited by blue light from the second LED array 526b it generates green to red light which in combination with unconverted blue excitation light generates a combined light emission 550 of the second color temperature.

It will be appreciated that depending on the relative proportion of light generated by the first and second LED arrays the color temperature of the LED-filament can be tuned between the first and second color temperatures. Additionally, particles of a light scattering material can be combined with the photoluminescence materials to reduce the quantity of photoluminescence material required to generate a given emission product color.

The double-layer LED-filament of FIG. 5 can be manufactured by depositing the photoluminescence layer 540 onto the first array of LED chips 526a, depositing the photoluminescence layer 554 onto the photoluminescence layer 540, depositing the photoluminescence layer 542 onto the second array of LED chips 326b, and depositing the photoluminescence layer 556 onto the photoluminescence layer 542. Next, the photoluminescence layer 544 can be deposited the back face 534 of the substrate 524 to cover at least the part of the substrate 524 positionally in correspondence with the first LED array 526a and the photoluminescence layer 546 deposited on the back face 534 of the substrate 524 to cover at least the part of the substrate 524 positionally in correspondence with the second LED array 526b. As illustrated, the photoluminescence layers 540, 542, 544, 546, 554, 556 can have a cross section that is generally semi-circular in profile.

The LED-filament of FIG. 5 can find particular utility where it is required that the first and second LED arrays generate light of substantially different color temperatures (>1500K difference), e.g., "warm white" and "cool white" thereby enabling the LED-filament to be tunable between "warm white" and "cool white". For example, the photoluminescence composition of the photoluminescence layers 540 and 554 can be configured such that the first LED array 526a in conjunction with the photoluminescence layers 540, 554 generates white light of a first color temperature, for example "warm white" (e.g. CCT 1800K to 2500K), while the second LED array 526b in conjunction with the photoluminescence layers 542, 556 generates white light of a second, higher, color temperature, for example "cool white" (e.g. CCT 3000K to 4000K). In one such LED-filament the photoluminescence layers 540, 542 can comprise, for example, a majority orange to red photoluminescence materials such as KSF and/or CASN and the photoluminescence layer 554 can comprise a mixture of GNYAG and optionally an orange to red photoluminescence material.

Figure 6:
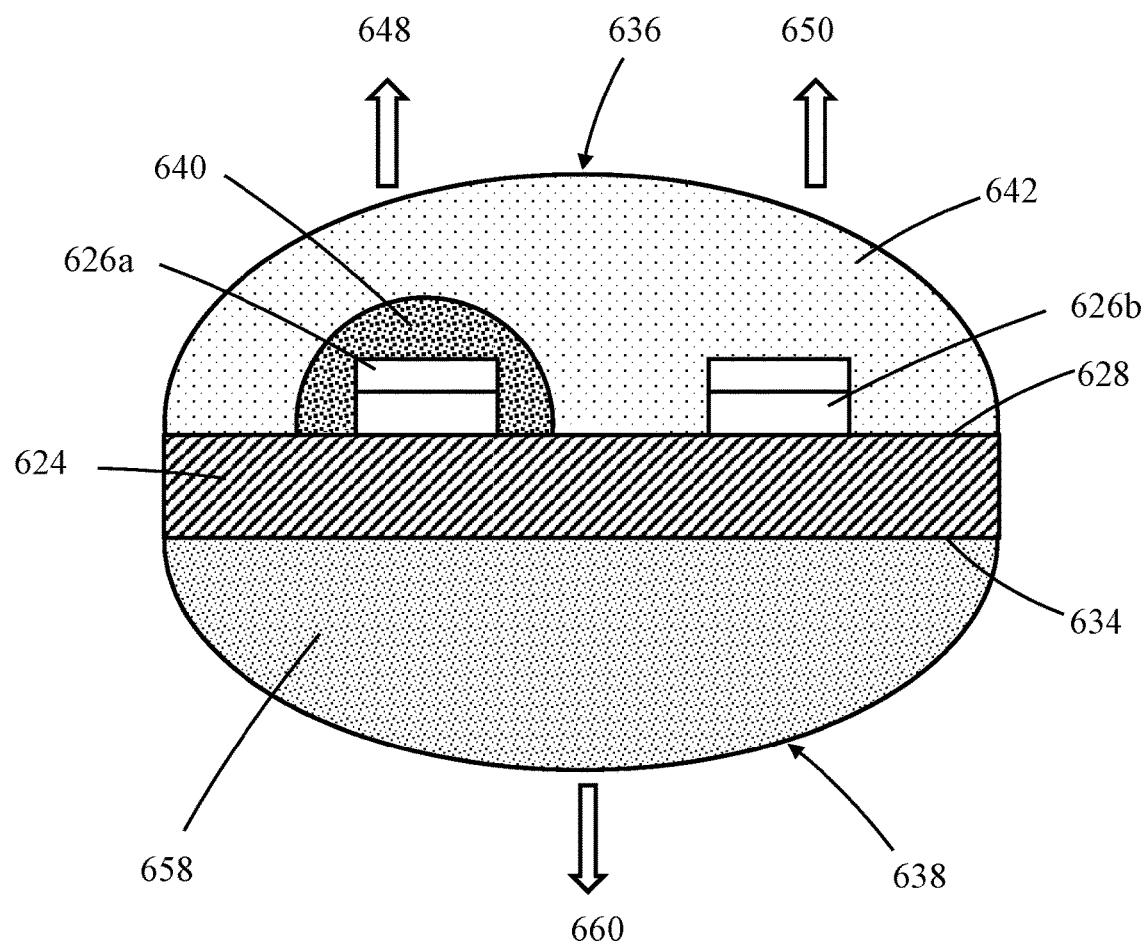
FIG. 6 is a schematic cross-sectional end view C-C of a color temperature tunable LED-filament in accordance with an embodiment of the invention comprising "single-layer" and "double-layer" photoluminescence arrangements.

FIG. 6 is a schematic cross-sectional end view C-C of a color temperature tunable LED-filament 608 in accordance with an embodiment of the invention comprising "double-layer" and "single-layer" photoluminescence arrangements. In the embodiment illustrated in FIG. 6, the first photoluminescence arrangement covering the first LED array comprises a "double-layer" structure, while second photoluminescence arrangement covering the second LED array comprises a "single-layer" structure.

In the embodiment of FIG. 6, a photoluminescence layer 640 comprising a first photoluminescence material is disposed on the first LED array 626a and a photoluminescence layer 642 comprising a second photoluminescence material is disposed on and covers both the photoluminescence layer 640 and the second LED array 626b. In this embodiment the first photoluminescence arrangement is constituted by the combination of the photoluminescence layers 640, 642 and consequently comprises a "double-layer" structure. The second photoluminescence arrangement is constituted by the photoluminescence layer 642 alone and consequently comprises a "single-layer".

The back face 634 of the substrate 624 can be covered with a photoluminescence layer 658 comprising a third photoluminescence material.

The first and second photoluminescence materials on the front face of the LED-filament are selected such that when they are excited by blue light from the first LED array 626a only they generate green to red light which in combination with unconverted blue excitation light generates a combined light emission 648 of the first color temperature. The first photoluminescence material may comprise a majority of an orange to red photoluminescence.

The second photoluminescence material on the front face of the LED-filament is selected such that when it excited by blue light from the second LED array 626b only it generates green to red light which in combination with unconverted blue excitation light generates a combined light emission 650 of the second color temperature.

The third photoluminescence material on the back face of the LED-filament is selected such that when it excited by blue light from the first and second LED arrays 626a, 626b it generates green to red light which in combination with unconverted blue excitation light generates a combined light emission 660 of a third color temperature that is between the first and second color temperatures.

Since the photoluminescence layer 642 covers the photoluminescence layer 640 this can improve mixing of light and improve color uniformity of emitted light.

It will be appreciated that depending on the relative proportion of light generated by the first and second LED arrays the color temperature of the LED-filament can be tuned between the first and second color temperatures. Additionally, particles of a light scattering material can be combined with the photoluminescence materials to reduce the quantity of photoluminescence material required to generate a given emission product color.

The LED-filament of FIG. 6 can be manufactured by first depositing the photoluminescence layer 640 onto the first LED array 626a and then depositing the photoluminescence layer 642 on the first photoluminescence layer 640 and on the second LED array 626b. The photoluminescence layer 658 can then be deposited on to cover the back face 628 of the substrate 624. As illustrated, the photoluminescence layers 640, 642, 644 can have a cross section that is generally semi-circular in profile. A particular advantage of the structure of the photoluminescence arrangement of FIG. 6 is its ease of fabrication since it comprises only two layers which also makes it structurally robust.

The LED-filament of FIG. 6 can find particular utility where it is required that the first and second LED arrays generate light of similar (<1500K difference), especially lower (warmer), color temperatures, e.g. "warm white" to "amber" and cooler "warm white" thereby enabling the LED-filament to be tunable between "amber" and "warm white". Such a range of color tuning is highly desirable for "warm dimming". For example, the photoluminescence compositions of the photoluminescence layers 640 and 642 can be configured such that the photoluminescence layers 640, 642 when excited by blue light from the first array of LEDs generates light of a first color temperature, for example "warm white" (e.g. CCT 1500K to 2500K), when excited by blue light from the second LED array generates light of a second, higher, color temperature, for example a cooler "warm white" (e.g. CCT 3000K to 4000K) and when excited equally by blue light from the first and second LED arrays generates light of an intermediate color temperature, for example 2700K.

While in each of the foregoing embodiments the first and second arrays of LED chips are mounted on the same face of the substrate for ease of fabrication and to reduce costs, it is contemplated in other embodiments to mount the first and second arrays of LED chips on opposite faces of the substrate.

In various embodiments of the invention, and to reduce photoluminescence material usage, the LED-filament can further comprise particles of a light scattering material such as for example particles of zinc oxide (ZnO), titanium dioxide ($TiO_2$) barium sulfate ($BaSO_4$), magnesium oxide (MgO), silicon dioxide ($SiO_2$), aluminum oxide ($Al_2O_3$), zirconium dioxide ($ZrO_2$) or mixtures thereof. The particles of light scattering material can be provided as a mixture with any of the photoluminescence materials and/or in a separate layer in contact with a photoluminescence material layer.

The inclusion of particles of a light scattering material with the photoluminescence material increases the number of collisions of LED generated excitation light with particles of the photoluminescence material enhancing photoluminescence light generation which decreases the amount of photoluminescence material usage. It is believed that on average as little as 1 in 10,000 interactions of a photon with a particle of photoluminescence material results in absorption and generation of photoluminescence light. The majority, about 99.99%, of interactions of photons with a photoluminescence material particle result in scattering of the photon. Since the inclusion of the light scattering materials increases the number of collisions this increases the probability of photoluminescence light generation, which decreases the amount of photoluminescence material usage required to generate a selected emission intensity.

Green to Yellow Photoluminescence Materials

In this patent specification, a broadband green to yellow photoluminescence material refers to a material which generates light having a peak emission wavelength ($\lambda_{pe}$) in a range ~520 nm to ~560 nm, which is in the yellow/green to green region of the visible spectrum. Preferably, the green photoluminescence material has a broad emission characteristic and preferably has a FWHM (Full Width at Half Maximum) of between about 50 nm and about 120 nm. The green photoluminescence material can comprise any photoluminescence material, such as for example, garnet-based inorganic phosphor materials, silicate phosphor materials and oxynitride phosphor materials. Examples of suitable green phosphors are given in TABLE 1.

In some embodiments, the green photoluminescence materials comprise a cerium-activated yttrium aluminum garnet phosphor of general composition $Y_3(Al_{1-y}Ga_y)_5O_{12}$:Ce (YAG) where 0<y<1 having a peak emission wavelength of in a range 520 nm to 543 nm and a FWHM of ~120 nm. In this patent specification, the notation YAG #represents the phosphor type—YAG-based phosphors—followed by the peak emission wavelength in nanometers (#). For example, YAG535 denotes a YAG phosphor with a peak emission wavelength of 535 nm. The green photoluminescence material may comprise a cerium-activated yttrium aluminum garnet phosphor of general composition $(Y,Ba)_3(Al,Ga)_5O_{12}$:Ce (YAG). In some embodiments, the green photoluminescence material can comprise an aluminate (LuAG) phosphor of general composition $Lu_3Al_5O_{12}$:Ce (GAL) having a peak emission wavelength of 516 nm to 560 nm and a FWHM of ~120 nm. In this patent specification, the notation GAL #represents the phosphor type (GAL)-LuAG—based phosphors—followed by the peak emission wavelength in nanometers (#). For example, GAL520 denotes a GAL phosphor with a peak emission wavelength of 520 nm. Suitable green phosphors are given in TABLE 1.

Examples of green silicate phosphors include europium activated ortho-silicate phosphors of general composition $(Ba, Sr)_2SiO_4$:Eu such as for example G, EG, Y and EY series of phosphors from Intematix Corporation, Fremont California, USA which have a peak emission wavelength in a range 507 nm to 570 nm and a FWHM of ~70 nm to ~80 nm. Suitable green phosphors are given in TABLE 1.

In some embodiments, the green phosphor can comprise a green-emitting oxynitride phosphor as taught in U.S. Pat. No. 8,679,367 entitled "Green-Emitting (Oxy) Nitride-Based Phosphors and Light Emitting Devices Using the Same" which is hereby incorporated in its entirety. Such a green-emitting oxynitride (ON) phosphor can have a general composition $Eu^{2+}:M^{2+}Si_4AlO_xN_{(7-2x/3)}$ where $0.1 \leq x \leq 1.0$ and $M^{2+}$ is one or more divalent metal selected from the group consisting of Mg, Ca, Sr, Ba, and Zn. In this patent specification, the notation ON#represents the phosphor type (oxynitride) followed by the peak emission wavelength ($\lambda_{pe}$) in nanometers (#). For example, ON495 denotes a green oxynitride phosphor with a peak emission wavelength of 495 nm.

TABLE 1

Example broadband green photoluminescence materials

| Phosphor | General Composition | | Wavelength $\lambda_p$ (nm) |
|---|---|---|---|
| YAG (YAG#) | $Y_{3-x}(Al_{1-y}Ga_y)_5O_{12}$:$Ce_x$ | 0.01 < x < 0.2 & 0 < y < 2.5 | 520-550 |
| GNYAG (YAG#) | $(Y, Ba)_{3-x}(Al_{1-y}Ga_y)_5O_{12}$:$Ce_x$ | 0.01 < x < 0.2 & 0 < y < 2.5 | 520-550 |
| LuAG (GAL#) | $Lu_{3-x}(Al_{1-y}M_y)_5O_{12}$:$Ce_x$ | 0.01 < x < 0.2 & 0 < y < 1.5 M = Mg, Ca, Sr, Ba, Ga, | 500-550 |
| LuAG (GAL#) | $Lu_{3-x}(Al_{1-y}Ga_y)_5O_{12}$:$Ce_x$ | 0.01 < x < 0.2 & 0 < y < 1.5 | 500-550 |
| Silicate | $A_2SiO_4$:Eu | A = Mg, Ca, Sr, Ba | 500-550 |
| Silicate | $(Sr_{1-x}Ba_x)_2SiO_4$:Eu | 0.3 < x < 0.9 | 500-550 |
| Oxynitride (ON#) | $Eu^{2+}:M^{2+}Si_4AlO_xN_{(7-2x/3)}$ | $M^{2+}$ = Mg, Ca, Sr, Ba, Zn $0.1 \leq x \leq 1.0$ | 500-550 |

Orange to Red Photoluminescence Materials
Narrowband Red Photoluminescence Materials In this patent specification, a narrowband red photoluminescence material refers to a photoluminescence material which, in response to stimulation by excitation light, generates light having a peak emission wavelength in a range 610 nm to 655 nm; that is light in the red region of the visible spectrum and which has a narrow emission characteristic with a full width at half maximum (FWHM) emission intensity of between about 5 nm and about 50 nm (less than about 50 nm). As described above, the narrowband red photoluminescence can comprise a manganese-activated fluoride red photoluminescence material that is disposed on and covers the front face of the substrate on which the LED chips are mounted. An example of a narrowband red manganese-activated fluoride photoluminescence material is manganese-activated potassium hexafluorosilicate phosphor (KSF)—$K_2SiF_6$:$Mn^{4+}$ (KSF). Other manganese-activated phosphors can include: $K_2GeF_6$:$Mn^{4+}$ (KGF) and $K_2TiF_6$:$Mn^{4+}$ (KTF).

Broadband Red Photoluminescence Materials

In this patent specification, a broadband red photoluminescence material (also referred to as a non-manganese-activated fluoride red photoluminescence material) refers to a photoluminescence material which, in response to stimulation by excitation light, generates light having a peak emission wavelength in a range 600 nm to 640 nm; that is light in the orange to red region of the visible spectrum and which has a broad emission characteristic with a full width at half maximum (FWHM) emission intensity of greater than about 50 nm. As described above, the broadband red photoluminescence can comprise rare-earth activated red photoluminescence materials. A broadband red photoluminescence material (non-manganese-activated fluoride red photoluminescence material) denotes a red photoluminescence material whose crystal structure is other than that of a narrowband red photoluminescence material (manganese-activated fluoride photoluminescence material), such as for example rare-earth-activated red photoluminescence materials and can comprise any such red photoluminescence material that is excitable by blue light and operable to emit light with a peak emission wavelength $\lambda_p$ in a range about 600 nm to about 640 nm. Rare-earth-activated red photoluminescence material can include, for example, a europium activated silicon nitride-based phosphor, $\alpha$-SiAlON, Group IIA/IIB selenide sulfide-based phosphor or silicate-based phosphor. Examples of red phosphors are given in TABLE 2.

In some embodiments, the europium activated silicon nitride-based phosphor comprises a Calcium Aluminum Silicon Nitride phosphor (CASN) of general formula $CaAlSiN_3$:$Eu^{2+}$. The CASN phosphor can be doped with other elements such as strontium (Sr), general formula (Sr,Ca)$AlSiN_3$:$Eu^{2+}$. In this patent specification, the notation CASN #represents the phosphor type (CASN) followed by the peak emission wavelength ($\lambda_{pe}$) in nanometers (#). For example, CASN625 denotes a red CASN phosphor with a peak emission wavelength of 625 nm.

In an embodiment, the rare—earth-activated red phosphor can comprise a red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$, wherein: M is Ca, and $0.1 \le a \le 0.4$; $1.5 < b < 2.5$; $4.0 \le c \le 5.0$; $0.1 \le d \le 0.15$; $7.5 < e < 8.5$; and $0 < f < 0.1$; wherein $a+b+f > 2+d/v$ and v is the valence of M.

Alternatively, the rare-earth-activated red phosphor can comprise a red emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 < x < 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites.

Rare-earth-activated red phosphors can also include Group IIA/IIB selenide sulfide-based phosphors. A first example of a Group IIA/IIB selenide sulfide-based phosphor material has a composition $MSe_{1-x}S_x$:Eu, wherein M is at least one of Mg, Ca, Sr, Ba and Zn and $0 < x < 1.0$. A particular example of this phosphor material is CSS phosphor ($CaSe_{1-x}S_x$:Eu). Details of CSS phosphors are provided in co-pending United States patent application Publication Number US2017/0145309 filed 30 Sep. 2016, which is hereby incorporated by reference in its entirety. The CSS red phosphors described in United States patent publication US2017/0145309 can be used in the present invention. The emission peak wavelength of the CSS phosphor can be tuned from 600 nm to 650 nm by altering the S/Se ratio in the composition and exhibits a narrowband red emission spectrum with FWHM in the range ~48 nm to ~60 nm (longer peak emission wavelength typically has a larger FWHM value). In this patent specification, the notation CSS #represents the phosphor type (CSS) followed by the peak emission wavelength in nanometers (#). For example, CSS615 denotes a CSS phosphor with a peak emission wavelength of 615 nm.

In some embodiments, the rare-earth-activated red phosphor can comprise an orange-emitting silicate-based phosphor as taught in U.S. Pat. No. 7,655,156 entitled "Silicate-Based Orange Phosphors" which is hereby incorporated in its entirety. Such an orange-emitting silicate-based phosphor can have a general composition $(Sr_{1-x}M_x)_yEu_zSiO_5$ where $0 < x \le 0.5$, $2.6 \le y \le 3.3$, $0.001 \le z \le 0.5$ and M is one or more divalent metal selected from the group consisting of Ba, Mg, Ca, and Zn. In this patent specification, the notation O #represents the phosphor type (orange silicate) followed by the peak emission wavelength ($\lambda_{pe}$) in nanometers (#). For example, O600 denotes an orange silicate phosphor with a peak emission wavelength of 600 nm.

TABLE 2

Example broadband red photoluminescence materials

| Phosphor | General Composition | | Wavelength $\lambda_p$ (nm) |
|---|---|---|---|
| CASN (CASN#) | $(Ca_{1-x}Sr_x)AlSiN_3$:Eu | $0.5 < x \le 1$ | 600-650 |
| 258 nitride | $Ba_{2-x}Sr_xSi_5N_8$:Eu | $0 \le x \le 2$ | 580-650 |
| Group IIA/IIB Selenide Sulfide (CSS#) | $MSe_{1-x}S_x$:Eu | M = Mg, Ca, Sr, Ba, Zn $0 < x < 1.0$ | 600-650 |
| CSS (CSS#) | $CaSe_{1-x}S_x$:Eu | $0 < x < 1.0$ | 600-650 |
| Silicate (O#) | $(Sr_{1-x}M_x)_yEu_zSiO_5$ | M = Ba, Mg, Ca, Zn $0 < x \le 0.5$ $2.6 \le y \le 3.3$ $0.001 \le z \le 0.5$ | 565-650 |

Figure 7A:
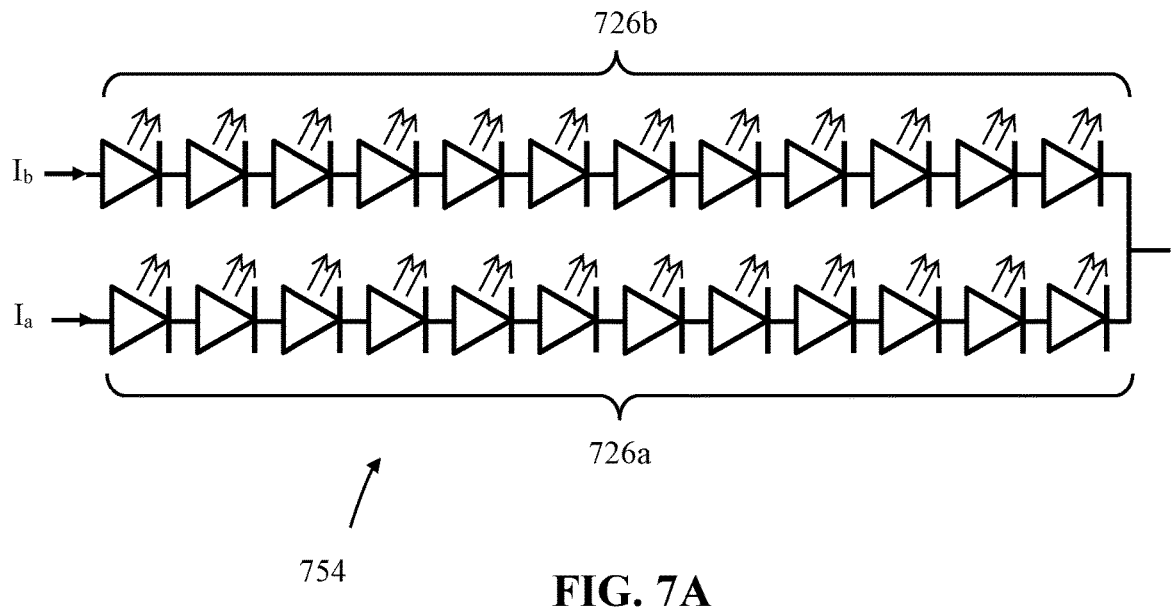
FIG. 7A is a schematic of a driver circuit arrangement for use with the color temperature tunable LED-filaments of FIGS. 3 to 6 with independent power control to the first and second LED arrays.

FIG. 7A is a schematic of a first driver circuit arrangement 762 for use with the color temperature tunable LED-filament of FIGS. 3 to 6 enabling independent power control to the first and second LED arrays. In the circuit arrangement 762 the first and second LED arrays 726a, 726b each comprise a string of serially electrically connected LEDs. As described above, the first LED array 726a in conjunction with their respective photoluminescence arrangement generate light of a first color temperature (warmer) while the second LED array 726b in conjunction with their respective photoluminescence arrangement generate light of a second higher color temperature that is cooler. As indicated, the first and second LED arrays can have the same numbers of LEDs. Since electrical power (e.g., current $I_a$ and $I_b$) applied to each of the LED arrays is independently controllable, the color of light generated by the LED-filament can be tuned by controlling the relative power (current) flowing through each LED string. It will be appreciated that the LED-filament can be operated to exhibit "warm diming", that is the color temperature of light generated by the LED-filament decreases (i.e. becomes warmer) as power to the LED-filament is decreased ("dimmed"), by the driver circuitry used to generate appropriate drive currents $I_a$ and $I_b$. Such driver circuitry can be housed within connector/base 102 (FIG. 1A) of the LED-filament bulb.

Figure 7B:
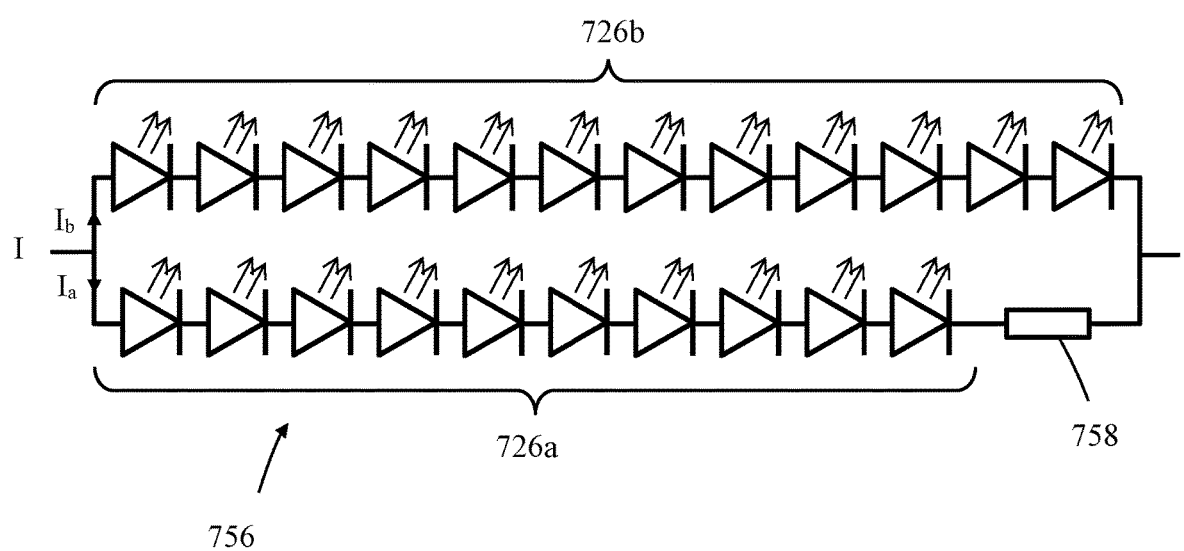
FIG. 7B is a schematic of a second driver circuit arrangement for use with the color temperature tunable LED-filaments of FIGS. 3 to 6 that exhibits "warm dimming"

FIG. 7B is a schematic of a second driver circuit arrangement 764 for use with the color temperature tunable LED-filament of FIGS. 3 to 6 that provides "warm dimming" without the use of additional circuitry. In the circuit arrangement 764 the first LED array 726a comprises a string of serially electrically connected LEDs with a resistive component (resistor) 766 and the second LED array 726a comprises a string of serially electrically connected LEDs. The first LED array 726a/resistor 766 and the second LED array 726b are electrically connected in parallel. As indicated in FIG. 7B, the number of LEDs in the first LED array 726a may be fewer than the number of LEDs in the second LED array 726b. The resistor 766 is typically mounted on the substrate of the LED-filament. As described above, the first LED array 726a in conjunction with its photoluminescence arrangement generate light of a first color temperature (warmer) while the second LED array 726b in conjunction with its photoluminescence arrangement generate light of a second higher color temperature (cooler). The effect of having different numbers of LEDs in each string and the addition of the resistor 766 in the first string is that the relative proportion of the current I applied to the LED-filament flowing through the first and second LEDs ($I_a$ and $I_b$ respectively) varies with applied power (current I). At low powers (current), i.e., corresponding to LED-filament being dimmed, a greater or even majority, proportion of the current flows through the first LED array 926a and the LED-filament thus produces light that is predominantly of the warmer color. As the current I is increased the voltage drop across resistor 766 increases which reduces the proportion of current $I_a$ flowing through the first LED array relative to the proportion $I_b$ flowing through the second LED array and the LED-filament produces light which becomes increasing cooler (higher color temperature). By appropriate configuration of the relative difference in numbers of LEDs in the first and second arrays and the resistance of the resistor 766, the LED-filament can be configured such that at full power, a greater, or majority, proportion of the current $I_b$ passes through the second LED array 726b and the LED-filament thus produces light that is predominantly of the cooler color. A particular benefit of the arrangement of FIG. 9B is that an LED-filament bulb utilizing such LED-filaments can be operated using a conventional dimmer and exhibit "warm dimming".

Figure 8A:
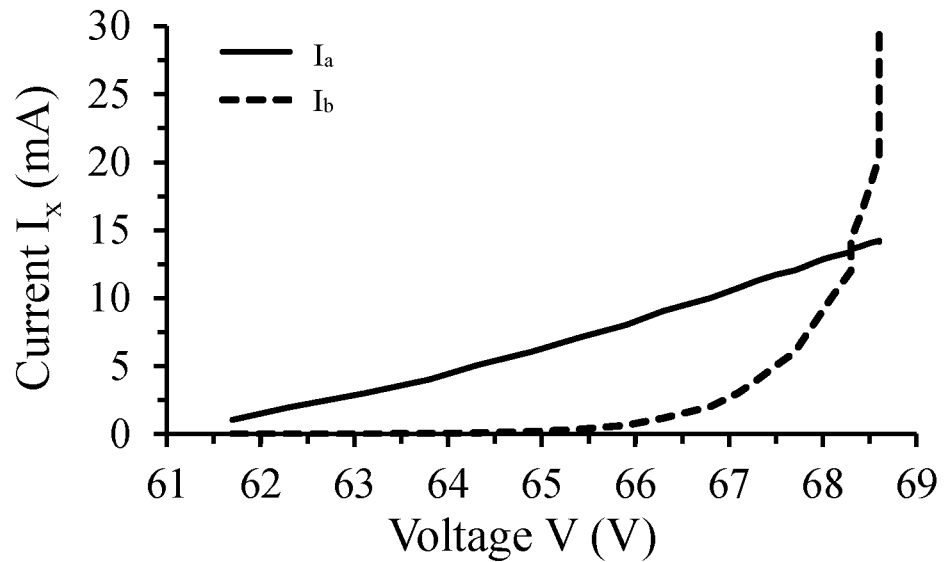
FIGS. 8A to 8C are test data for a first "warm dimming" LED-filament in accordance with FIG. 7B and respectively show: (a) current/voltage characteristic of the first and second LED arrays of the LED-filament, (b) currents $I_a$ and $I_b$ (mA) flowing through the first and second LED arrays as a function of filament power (W), and (c) current ratio $I_x/I$ (%) for currents $I_a$ and $I_b$ flowing through the first and second LED arrays as a function of filament power (W)
Figure 8B:
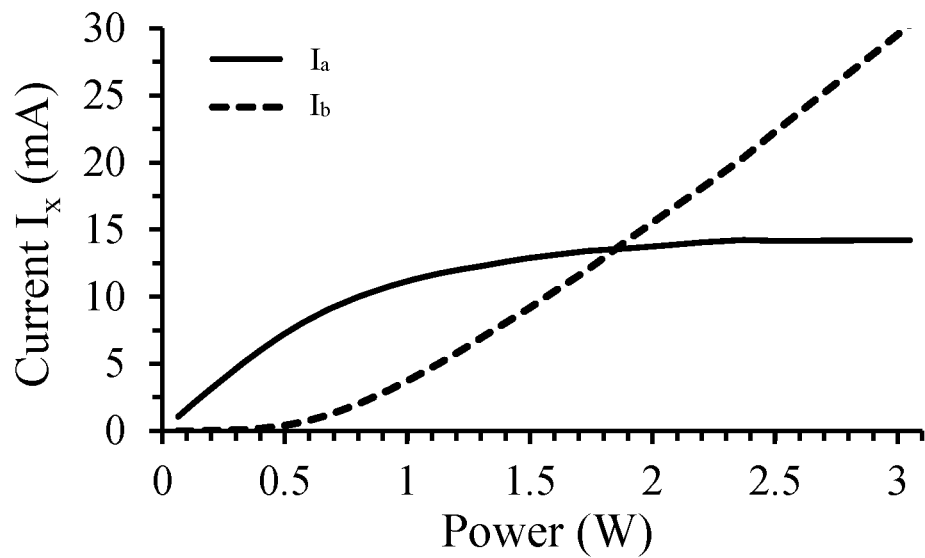
Figure 8C:
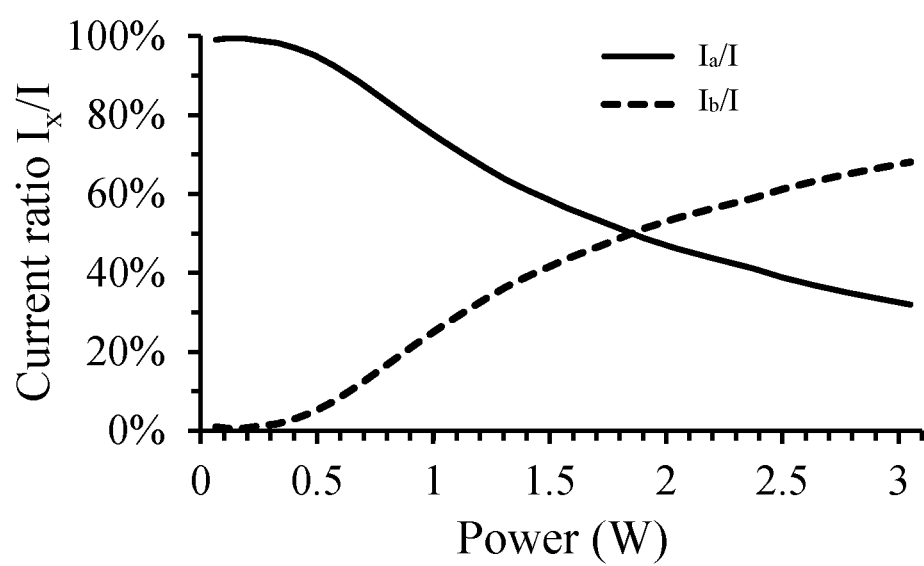

FIGS. 8A to 8C are test data for a first "warm dimming" LED-filament in accordance with FIG. 7B and respectively show: (a) current/voltage (Is/V) characteristic of the first and second LED arrays of the LED-filament, (b) currents $I_a$ and $I_b$ (mA) flowing through the first and second LED arrays as a function of filament power (W), and (c) current ratio k/I (%) for currents $I_a$ and $I_b$ flowing through the first and second LED arrays as a function of filament power (W). In this example, the first LED array 726a comprises twenty-four LED chips and a 4000 resistor 766 and the second LED array 726b comprises twenty-six LED chips. Referring to FIG. 8A, it is to be noted that due to the presence of the resistor 766 the current/voltage ($I_a$/V) characteristic of the first LED array (warmer) has a generally linear characteristic. This is to be contrasted with the current/voltage ($I_b$/V) characteristic of the second LED array (cooler) which, as would be expected, exhibits a typical exponentially increasing LED characteristic. It is as a result of these different characteristics that enables "warm dimming". Referring to FIG. 8B, it is to be noted that as the current I applied to the LED-filament increases the current $I_a$ flowing through the first LED array increases and flattens out at maximum (saturation) value of about 15 mA, while the current $I_b$ flowing through the second LED array continues to increase. As can be seen from FIG. 8C in terms of current, is that at low powers (0.05 W to 0.3 W—5% to 10% maximum power), corresponding to dimming, virtually 100% of the current I flows through the first LED array and the LED-filament generates light of a warm color. As power is increased to the LED-filament, the current $I_a$ flowing through the first LED array decreases while the current $I_b$ flowing through the second LED array increases. At maximum power (about 3 W), about 30% of the current I flows through the first LED array and a majority (70%) of the current I flows through the second LED array. As a result, at maximum power, the LED-filament generates light of a cooler (i.e., higher CCT) color.

Figure 9A:
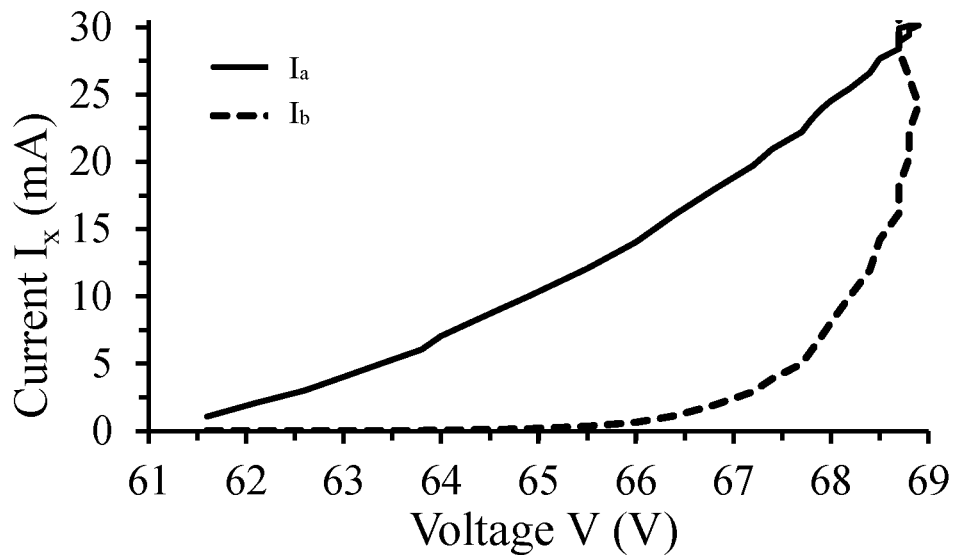
FIGS. 9A to 9C are test data for a second "warm dimming" LED-filament in accordance with FIG. 7B and respectively show: (a) current/voltage characteristic of the first and second LED arrays of the LED-filament, (a) currents $I_a$ and $I_b$ (mA) flowing through the first and second LED arrays as a function of filament power (W), and (c) current ratio ha (%) for currents $I_a$ and $I_b$ flowing through the first and second LED arrays as a function of filament power (W)
Figure 9B:
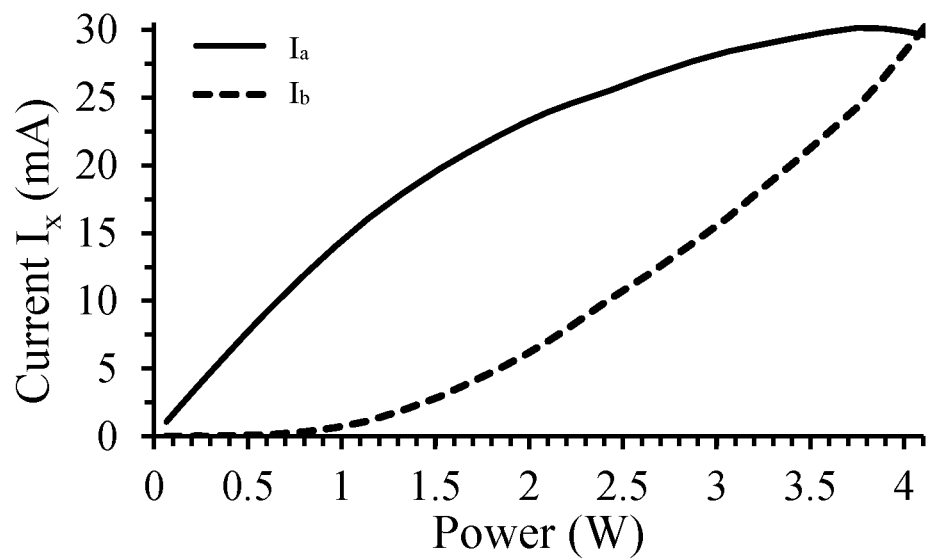
Figure 9C:
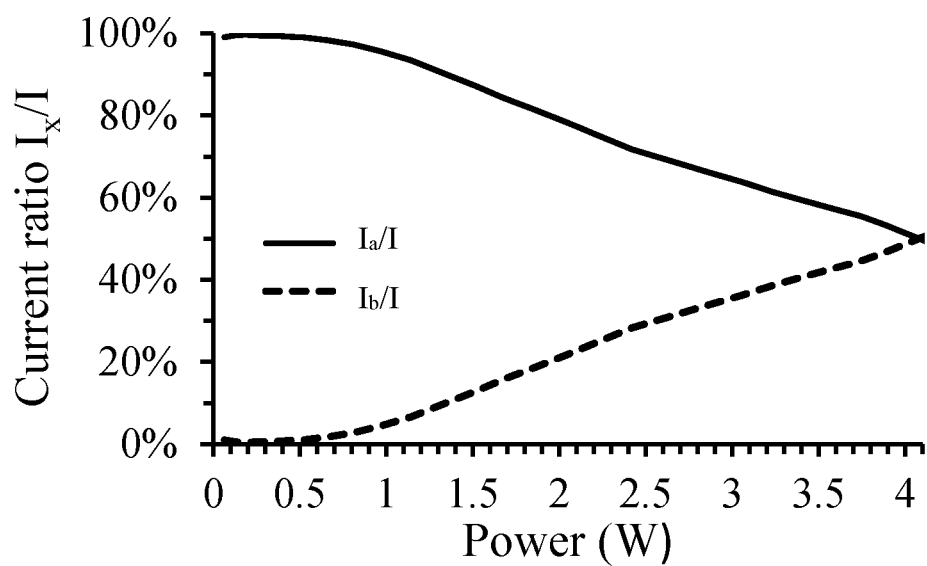

FIGS. 9A to 9C are test data for a second "warm dimming" LED-filament in accordance with FIG. 7B and respectively show: (a) current/voltage (IJV) characteristic of the first and second LED arrays of the LED-filament, (b) currents $I_a$ and $I_b$ (mA) flowing through the first and second LED arrays as a function of filament power (W), and (c) current ratio (%) for currents $I_a$ and $I_b$ flowing through the first and second LED arrays as a function of filament power (W). In this example, the first LED array 726a comprises twenty-four LED chips and a 2000 resistor and the second LED array 726b comprises twenty-six LED chips. These figures indicate how the relative current flowing through the and second arrays of LEDs at maximum power (about 4 W) can be selected using the resistance of the resistor 766 and thereby select the color of light generated by the LED-filament at maximum power. As can be seen from FIG. 9A, the effect of reducing the resistance of resistor 766 is an increase in the slope of the current/voltage ($I_a$/V) characteristic of the first LED array. This results in the first LED array now having a maximum (saturation) value of about 30 mA at full power. As a result, at full power the LED-filament will generate light of CCT that is between warmer and cooler colors.

Figure 10A:
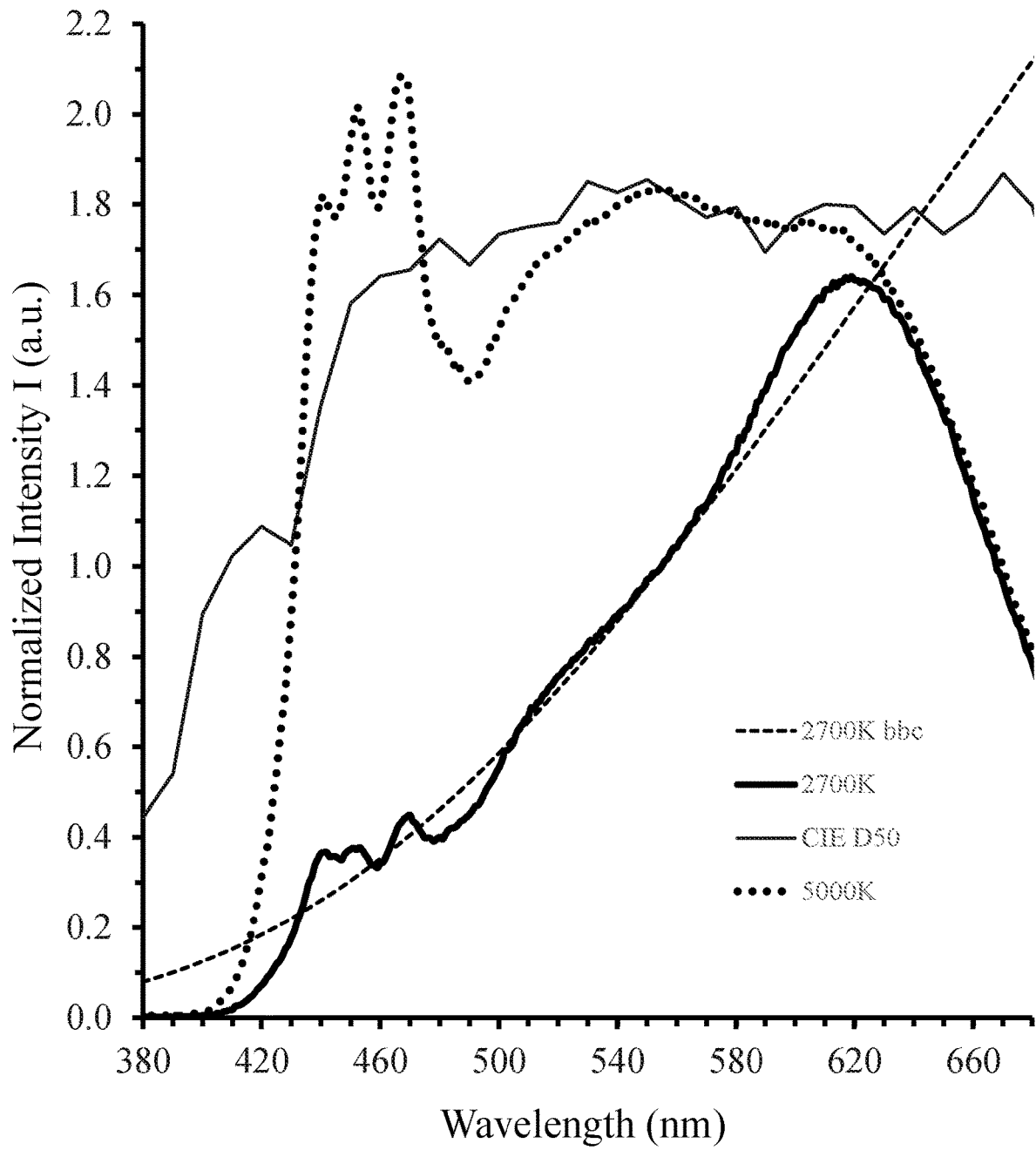
FIGS. 10A and 10B are measured test data for a tunable LED-filament with the photoluminescence arrangement of FIG. 6 comprising a first LED array for generating light of CCT 2700K and a second LED array for generating light of CCT 5000K.
Figure 10B:
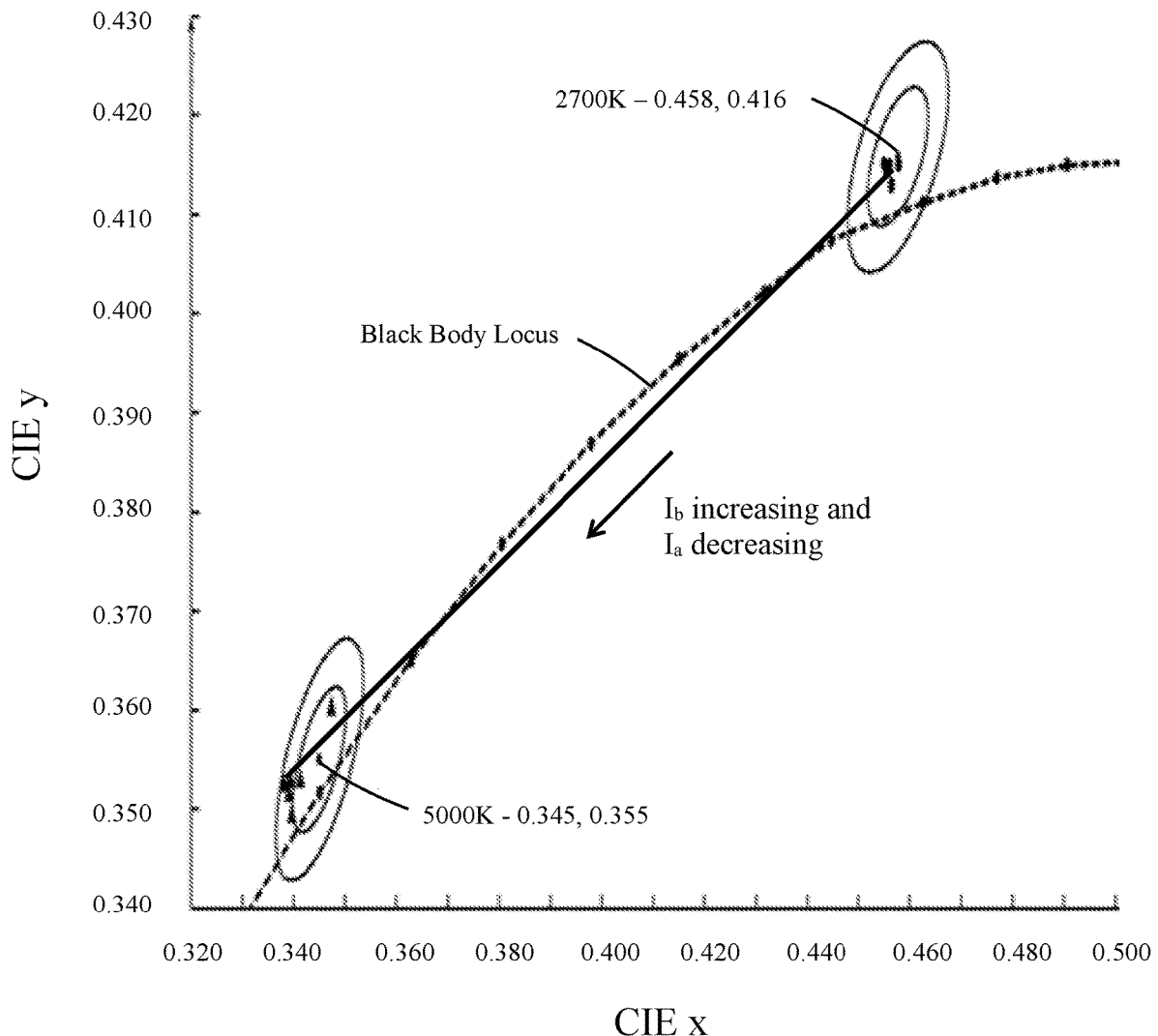

FIGS. 10A and 10B are measured test data for a tunable LED-filament with the photoluminescence arrangement of FIG. 6 comprising a first LED array for generating light of CCT 2700K and a second LED array for generating light of CCT 5000K. FIG. 10A shows intensity spectra, normalized intensity I versus wavelength (nm) for (i) the LED-filament for operation of the first LED array only (2700K—thick solid line), (ii) black-body-curve (bbc)—Planckian spectrum (2700K—dashed line) for a CCT of 2700K, (iii) the LED-filament for operation of the second LED array only (5000K—dotted line), and (iv) CIE Standard Illuminant D50 (CIE D50-thin solid line) for a CCT of 5000K. FIG. 10B shows measured CIE 1931 chromaticity data CIE x, CIE y for (i) the LED-filament for operation of the first LED array only (circular dots), (ii) the LED-filament for operation of the second LED array only (triangular points), (iii) locus of chromaticity (color temperature) change (solid line) for operation of both LED arrays, and (iv) the black body locus for reference (dashed line). FIG. 10B further includes chromaticity coordinates (CIE x and CIE y) for ANSI standard coordinates for 2700K (0.458, 0.416) and 5000K (0.345, 0.355) and their respective 3 and 5 step MacAdam ellipses. The tunable LED-filament comprises a ceramic substrate of dimensions 30 mm by 3.5 mm having first and second LED arrays each comprising 25 LED chips (dies).

As can be seen from FIG. 10A, when electrical power is applied to only the first LED array (i.e., $I=I_a$ & $I_b=0$), the LED-filament produces light of CCT 2700K whose spectra (thick solid line) closely resembles the black body curve (dashed line) of the same color temperature. It will be further seen that when electrical power is applied to only the second LED array (i.e., $I=I_b$ & $I_a=0$) the LED-filament produces light of CCT 5000K whose spectra (dotted line) closely resembles the CIE Standard Illuminant D50 (thin solid line). In terms of chromaticity, it will be seen from FIG. 10B that when electrical power is applied only to the first LED array (i.e. $I=I_a$ & $I_b=0$) the LED-filament produces light (circular dots) of CCT 2700K whose chromaticity is very close to the black body locus (dashed line) and is within the 3 step MacAdam ellipse of the ANSI standard coordinates for 2700K. Moreover, when electrical power is applied only to the second LED array (i.e. $I=I_b$ & $I_a=0$) the LED-filament produces light (triangular points) of CCT 5000K whose chromaticity is very close to the black body locus (dashed line) and is within the 3 step MacAdam ellipse of the ANSI standard coordinates for 5000K. The solid line in FIG. 10B is the locus of the chromaticity of light generated by the LED-filament as the proportion of power (i.e., $I_a$, $I_b$) applied to the first and second LED arrays is varied, for example, from $I=I_a$ & $I_b=0$ to $I=I_b$ & $I_a=0$. The locus, which is substantially a straight line, connects the chromaticity coordinates for the color temperatures 2700K ($I=I_a$ & $I_b=0$) and 5000K (i.e. $I=I_b$ & $I_a=0$) and demonstrates that LED-filaments in accordance with the invention are capable of producing light of any color temperature from 2700K to 5000K by varying the proportion of $I_a$ and $I_b$.

As used in this document, both in the description and in the claims, and as customarily used in the art, the words "substantially," "approximately," and similar terms of approximation are used to account for manufacturing tolerances, manufacturing variations, and manufacturing imprecisions that are inescapable parts of fabricating and operating any mechanism or structure in the physical world.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Statements in the abstract of this document, and any summary statements in this document, are merely exemplary; they are not, and cannot be interpreted as, limiting the scope of the claims; the purpose of the abstract is to enable the U.S. Patent and Trademark Office, as well as readers who are not familiar with patent or legal terms or phraseology, to determine quickly from a cursory inspection the nature and essence of the technical disclosure of the application. Further, the figures are merely exemplary and not limiting.

Topical headings and subheadings are for the convenience of the reader only. They should not and cannot be construed to have any substantive significance, meaning or interpretation, and should not and cannot be deemed to indicate that all of the information relating to any particular topic is to be found under or limited to any particular heading or subheading. Therefore, the invention is not to be restricted or limited except in accordance with the following claims and their legal equivalents.

REFERENCE NUMERALS

Prefix #=Figure Number
00 LED-filament lamp
02 Connector base
04 Envelope
06 LED-filament support
08 LED-filament
10 Volume
12 Lamp axis
14 First electrical contact
16 First wire
18 Second electrical contact
20 Second wire
22 Base portion of LED-filament support
24 Light-transmissive substrate
26 LED chip
28 Front face of substrate
30 Bond wire
32 Bond wire
34 Back face of substrate
36 Photoluminescence wavelength conversion coating on front face of substrate
38 Photoluminescence wavelength conversion coating on back face of substrate
40 Photoluminescence layer (front face)
42 Photoluminescence layer (front face)
44 Photoluminescence layer (back face)
46 Photoluminescence layer (back face)
48 First color temperature light
50 Second color temperature light
52 Diffusing layer
54 Photoluminescence layer (front face)
56 Photoluminescence layer (front face)
58 Photoluminescence layer (back face)
60 Third color temperature light Photoluminescence layer (front face)
62 First driver circuit arrangement
64 Second driver circuit arrangement
66 Resistive load

What is claimed is:

1. An LED lamp for generating light of a color temperature that decreases with decreasing power applied to the LED lamp, the LED lamp comprising:
a first LED string of serially connected first LED chips,
a second LED string of serially connected second LED chips,
a first photoluminescence arrangement for covering the first LED string for generating light of a first color temperature,
a second photoluminescence arrangement for covering the second LED string for generating light of a second different color temperature, and
a linear resistor serially connected with the first LED string;
wherein the first LED string and second LED string are connected in parallel; and wherein a current/voltage characteristic (I-V) of the first LED string increases substantially linearly with increasing voltage and a current/voltage characteristic (I-V) of the second LED string increases generally exponentially with increasing voltage.

2. The LED lamp of claim 1, wherein a proportion of current flowing through the first LED string compared with a proportion of current flowing through the second LED string depends on the power applied to the LED lamp.

3. The LED lamp of claim 1, wherein at a maximum operating power, current passes through both the first and second LED strings and a color temperature of light generated by the LED lamp is between the first and second color temperatures; and wherein at a minimum operating power, a majority of current flows through the first LED string and a color temperature of light generated by the LED lamp is substantially the first color temperature.

4. The LED lamp of claim 3, wherein at the maximum operating power, at least 50% of the current flows through the second LED string.

5. The LED lamp of claim 1, wherein the first LED string comprises fewer LED chips than the second LED string.

6. The LED lamp of claim 1, wherein the second photoluminescence arrangement additionally covers the first photoluminescence arrangement.

7. The LED lamp of claim 1, wherein the first photoluminescence arrangement comprises a narrowband red phosphor selected from the group consisting of: $K_2SiF_6:Mn^{4+}$, $K_2GeF_6:Mn^{4+}$, and $K_2TiF_6:Mn^{4+}$.

8. The LED lamp of claim 1, wherein the first color temperature is from 1800K to 2500K, and the second color temperature is from 3000K to 4000K.

9. The LED lamp of claim 1, comprising a connector base.

10. The LED lamp of claim 1, comprising a light transmissive envelope.

11. The LED lamp of claim 1, comprising an at least partially light transmissive substrate on which the first LED string and the second LED string are mounted.

12. The LED lamp of claim 1, wherein the linear resistor is in the first LED string.

* * * * *